(12) United States Patent
Kikuchi et al.

(10) Patent No.: US 6,682,944 B2
(45) Date of Patent: Jan. 27, 2004

(54) SEMICONDUCTOR DEVICE MANUFACTURING METHOD

(75) Inventors: Hideaki Kikuchi, Kawasaki (JP); Genichi Komuro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/283,277

(22) Filed: Oct. 30, 2002

(65) Prior Publication Data

US 2003/0166326 A1 Sep. 4, 2003

(30) Foreign Application Priority Data

Feb. 28, 2002 (JP) ........................ 2002-054440

(51) Int. Cl.[7] ............... H01L 21/00; H01L 21/8242
(52) U.S. Cl. ................. 438/3; 438/240; 438/250; 438/253; 438/396
(58) Field of Search ................... 438/396, 393, 438/386, 253, 250, 240, 239, 3

(56) References Cited

U.S. PATENT DOCUMENTS

| | | | |
|---|---|---|---|
| 5,515,984 A | 5/1996 | Yokoyama et al. | ........... 216/41 |
| 5,840,200 A | * 11/1998 | Nakagawa et al. | ......... 438/722 |
| 6,169,009 B1 | 1/2001 | Ju et al. | ...................... 438/396 |
| 6,232,174 B1 | * 5/2001 | Nagata et al. | .............. 438/253 |
| 6,388,281 B1 | * 5/2002 | Jung et al. | ....................... 438/3 |

FOREIGN PATENT DOCUMENTS

| | | |
|---|---|---|
| JP | 8-45905 | 2/1996 |
| JP | 11-354510 | 12/1999 |
| JP | 2001036024 A | 2/2001 |

* cited by examiner

Primary Examiner—Michael Trinh
(74) Attorney, Agent, or Firm—Westerman, Hattori, Daniels & Adrian, LLP

(57) ABSTRACT

There is provided a semiconductor device manufacturing method having a ferroelectric or high-dielectric capacitor, which comprises the steps of forming an underlying insulating film over a semiconductor substrate, forming a first conductive film on the underlying insulating film, forming a dielectric film consisting of ferroelectric material and high-dielectric material on the first conductive film, forming a second conductive film on the dielectric film, etching selectively the second conductive film in a first atmosphere containing a bromine to form a capacitor upper electrode, etching selectively the dielectric film in a second atmosphere containing a chlorine to form a capacitor dielectric film, and etching selectively the first conductive film in a third atmosphere containing the bromine to form a capacitor lower electrode.

38 Claims, 16 Drawing Sheets

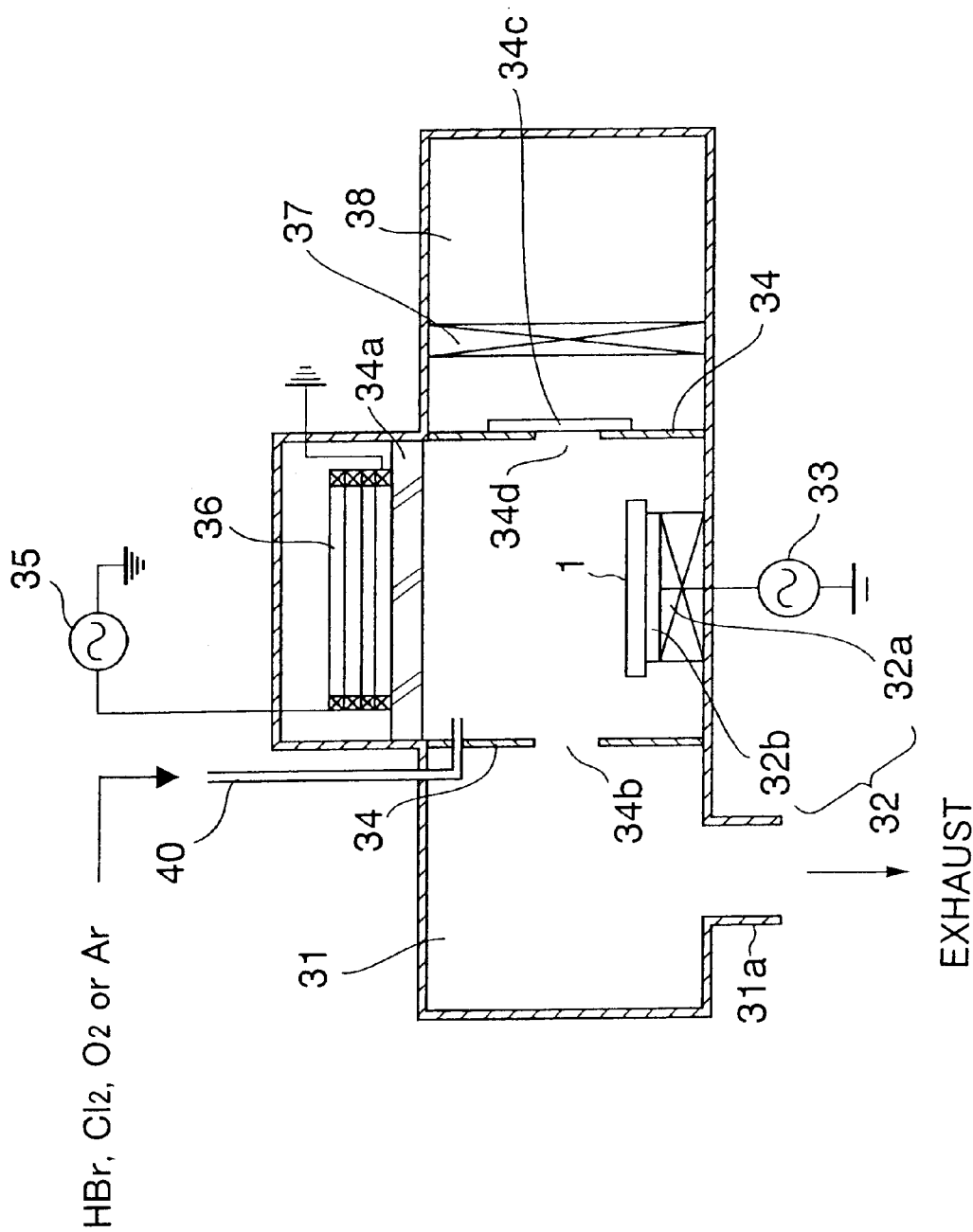

$O_2 : 20\%$ $O_2 : 50\%$ $O_2 : 80\%$ $O_2 : 90\%$

Cl₂ : 10sccm
O₂ : 40sccm

THE TAPER ANGLE OF
THE CAPACITOR SIDE FACE : 81°

HBr : 10sccm
O₂ : 40sccm

THE TAPER ANGLE OF
THE CAPACITOR SIDE FACE : 79°

STAGE TEMPERATURE; 400°C

PZT

STAGE TEMPERATURE; 350°C

PZT

PRESSURE; 0.4Pa

PZT

PRESSURE; 0.15Pa

PZT

Ar : 10sccm
Cl$_2$ : 40sccm

PZT

Ar : 40sccm
Cl$_2$ : 10sccm

PZT

WAFER STAGE TEMPERATURE: 300°C
TAPER ANGLE θ OF A SIDE FACE : 76°

WAFER STAGE TEMPERATURE: 400°C
TAPER ANGLE θ OF A SIDE FACE: 79°

SEMICONDUCTOR DEVICE MANUFACTURING METHOD

CROSS-REFERENCE TO RELATED APPLICATIONS

This application is based upon and claims priority of Japanese Patent Application NO. 2002-054440, filed in Feb. 28, 2002, the contents being incorporated herein by reference.

BACKGROUND OF THE INVENTION

1. Field of the Invention

The present invention relates to a semiconductor device manufacturing method and, more particularly, a semiconductor device manufacturing method having the step of etching the electrode material that constitutes the capacitor using the ferroelectric substance or the high-dielectric substance.

2. Description of the Prior Art

In recent years, it is expected that the semiconductor memory using the ferroelectric capacitor or the high-dielectric capacitor is a promising device. The ferroelectric capacitor is formed by following steps, for example.

First, as shown in FIG. 1A, the first metal film 102, the ferroelectric film 103, and the second metal film 104 are formed sequentially on the insulating film 101, and then the resist pattern 105 having the capacitor shape is formed on the second metal film 104.

Then, the second metal film 104, the ferroelectric film 103, and the first metal film 102 are etched sequentially by using the resist pattern 105 as a mask. According to this patterning, as shown in FIG. 1B, the second metal film 104 acts as the upper electrode 104a of the capacitor 106, the ferroelectric film 103 acts as the dielectric film 103a of the capacitor 106, and the first metal film 102 acts as the lower electrode 102a of the capacitor 106.

Meanwhile, since the first metal film 102 and the second metal film 104 are formed of a noble metal such as iridium, platinum, etc. or its oxide respectively and the ferroelectric film 103 is formed of PZT system material, they have the poor chemical reactivity at the normal temperature. Thus, the second metal film 104, the ferroelectric film 103, and the first metal film 102 are successively etched mainly by the sputter reaction at the time of the patterning. As the etching gas in the sputter, mainly the mixed gas consisting of an inert gas such as argon and chlorine is employed.

If the metal film is etched by the sputter using argon and chlorine, the adhesion of the conductive strong sidewall deposition (fence) onto the side surface of the capacitor 106 is brought about.

Therefore, in order to suppress the formation of the fence, such a structure is employed that an inclination angle of the side surface of the capacitor 106 is set gently (made small) by setting the etching conditions that make the side surface of the resist pattern 105 retreat, or the shape of the capacitor 106 is formed stepwise.

However, since the gentle inclination angle of the side surface of the capacitor leads to the increase of the capacitor area, such gentle inclination angle interferes with the miniaturization and the higher integration of the semiconductor device having the capacitor. In addition, in the etching to form the capacitor, the optimum etching rate that is suited to the film cannot be assured only by the chlorine and the inert gas.

SUMMARY OF THE INVENTION

It is an object of the present invention to provide a semiconductor device manufacturing method capable of assuring the optimum etching according to each of the films constituting a capacitor.

The above subjects can be overcome by providing a semiconductor device manufacturing method which comprises the steps of forming an underlying insulating film over a semiconductor device; forming a first conductive film on the underlying insulating film; forming a dielectric film consisting of ferroelectric material and high-dielectric material on the first conductive film; forming a second conductive film on the dielectric film; etching selectively the second conductive film in a first atmosphere containing a bromine to shape the second conductive film into a capacitor upper electrode; etching selectively the dielectric film in a second atmosphere containing a chlorine to shape the dielectric film into a capacitor dielectric film; and etching selectively the first conductive film in a third atmosphere containing the bromine to shape the first conductive film into a capacitor lower electrode.

The above subjects can be overcome by providing a semiconductor device manufacturing method which comprises the steps of forming an underlying insulating film over a semiconductor device; forming a first conductive film on the underlying insulating film; forming a dielectric film consisting of ferroelectric material and high-dielectric material on the first conductive film; forming a second conductive film on the dielectric film; etching selectively the second conductive film in a first atmosphere, into which a first etching gas and an oxygen are introduced, to shape the second conductive film into a capacitor upper electrode; etching selectively the dielectric film in a second atmosphere, into which a second etching gas not-containing the oxygen is introduced, to shape the dielectric film into a capacitor dielectric film; and etching the first conductive film exposed from a mask in a third atmosphere, into which a third etching gas and the oxygen are introduced, to shape the first conductive film into a capacitor lower electrode.

According to the present invention, the conductive film constituting the capacitor electrode is etched in the Br-containing atmosphere when such conductive film is patterned, and the ferroelectric film or the high-dielectric film constituting the capacitor dielectric film is etched in the Cl-containing atmosphere when such film is patterned.

Therefore, the side surfaces of the capacitor electrode pattern is shaped into the almost perpendicular shape to contribute the higher integration of the semiconductor device, and also the degradation in the film quality of the dielectric film pattern is suppressed and thus the deterioration of the capacitor characteristics is prevented.

Also, according to another invention, the conductive film constituting the capacitor electrode is etched in the etching atmosphere containing the oxygen when such conductive film is patterned, and the ferroelectric film or the high-dielectric film constituting the capacitor dielectric film is etched in the etching atmosphere into which the gas except the oxygen is introduced when such film is patterned.

Therefore, the degradation of the dielectric film is suppressed in forming the capacitor electrode and also the reduction of the etching rate of the dielectric film is prevented, when the dielectric film consists of oxide. As the dielectric film, there is the oxide insulating film such as PZT system, for example.

BRIEF DESCRIPTION OF THE DRAWINGS

FIG. 3 is a configurative view showing an example of the etching equipment used to form the semiconductor device according to an embodiment of the present invention;

DESCRIPTION OF THE PREFERRED EMBODIMENTS

Embodiments of the present invention will be explained with reference to the accompanying drawings hereinafter.

FIGS. 2A to 2J are sectional views showing steps of manufacturing a semiconductor device according to an embodiment of the present invention.

Figure 1A:
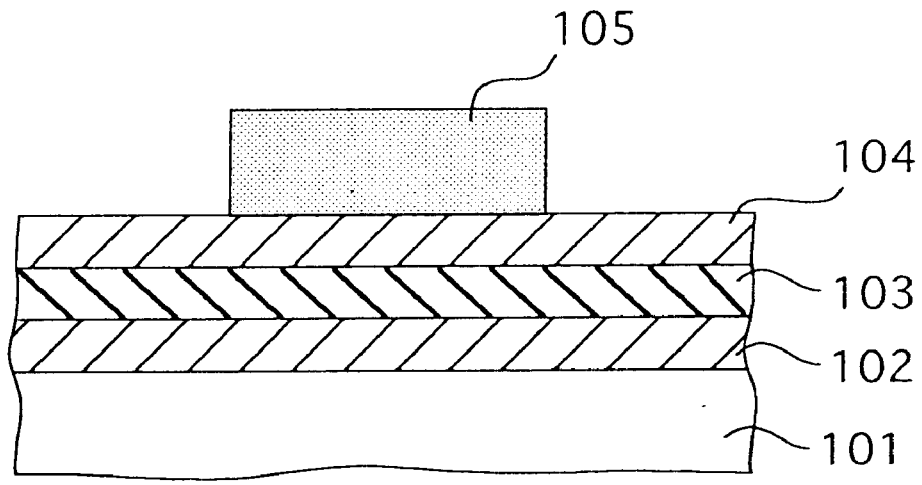
FIGS. 1A and 1B are sectional views showing steps of forming the capacitor in the prior art.
Figure 1B:
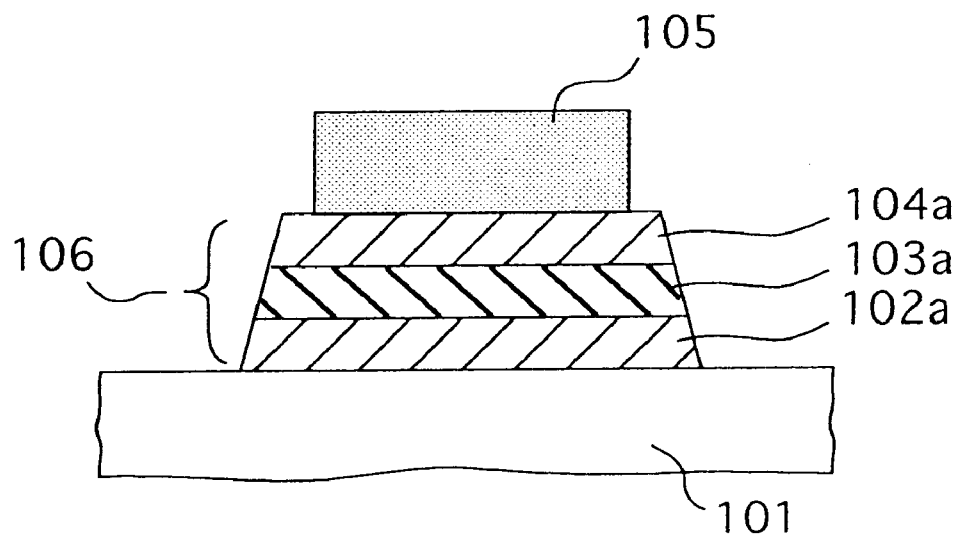
Figure 2A:
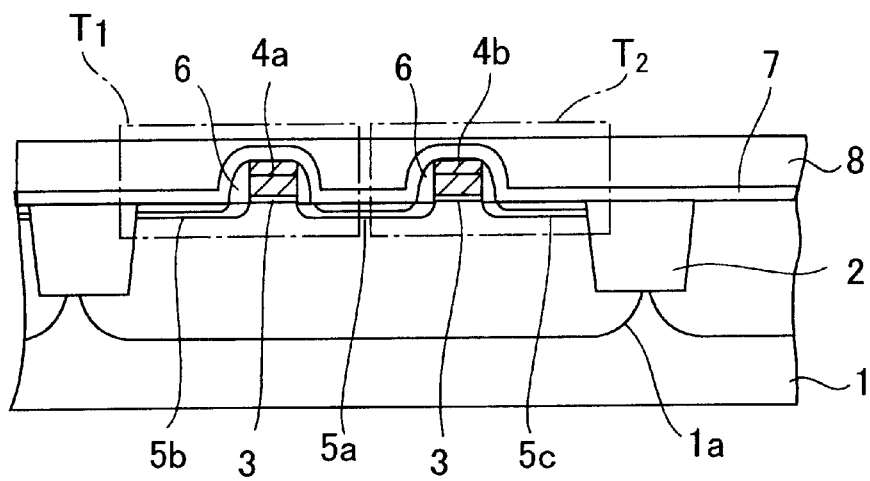
FIGS. 2A to 2J are sectional views showing steps of forming a semiconductor device according to an embodiment of the present invention.

First, steps required until a sectional structure shown in FIG. 2A is formed will be explained hereunder.

As shown in FIG. 2A, an element isolation recess is formed around a transistor forming region of an n-type or p-type silicon (semiconductor) substrate 1 by the photolithography method. Then, an element isolation insulating film 2 is formed by burying silicon oxide ($SiO_2$) in the element isolation recess. The element isolation insulating film 2 having such structure is called STI (Shallow Trench Isolation). In this case, an insulating film formed by the LOCOS (Local Oxidation of Silicon) method may be employed as the element isolation insulating film.

Then, a p-type well 1a is formed by introducing the p-type impurity into a transistor forming region on the silicon substrate 1. Then, a silicon oxide film serving as a gate insulating film 3 is formed by thermally oxidizing a surface of the transistor forming region on the silicon substrate 1.

Then, gate electrodes 4a, 4b are formed by forming sequentially an amorphous silicon film or a polysilicon film and a tungsten silicide film on the overall upper surface of the silicon substrate 1 and then patterning the silicon film and the tungsten silicide film by virtue of the photolithography method.

In this case, two gate electrodes 4a, 4b are formed in parallel on one p-type well 1a and these gate electrodes 4a, 4b constitute a part of the word line. A width of the gate electrodes 4a, 4b is 0.18 µm, for example.

Then, first to third impurity diffusion regions 5a to 5c serving as source/drain regions are formed by ion-implanting the n-type impurity into the p-type well 1a on both sides of the gate electrodes 4a, 4b.

Then, an insulating film, e.g., a silicon oxide ($SiO_2$) film is formed on the overall surface of the silicon substrate 1 by the CVD method, and then the insulating film is left on both sides of the gate electrodes 4a, 4b as insulating sidewall spacers 6 by etching back the insulating film.

Then, the first to third impurity diffusion regions 5a to 5c are formed into the LDD structure by ion-implanting the n-type impurity again into the first to third impurity diffusion regions 5a to 5c while using the gate electrodes 4a, 4b and the sidewall spacers 6 as a mask.

The first impurity diffusion region 5a formed between two gate electrodes 4a, 4b in one transistor forming region is connected electrically to the bit line, and also the second and third impurity diffusion regions 5b, 5c formed on both sides of the transistor forming region are connected electrically to the lower electrodes of the capacitors.

According to the above steps, two MOS transistors $T_1$, $T_2$ having the gate electrodes 4a, 4b and the impurity diffusion regions 5a to 5c having the LDD structure are formed in the p-type well 1a.

Then, a silicon oxide nitride (SiON) film of about 200 nm thickness is formed on the overall surface of the silicon substrate 1 as a cover insulating film 7, that covers the MOS transistors $T_1$, $T_2$, by the plasma CVD method. Then, a silicon oxide ($SiO_2$) film of about 1.0 μm thickness is formed on the cover insulating film 7 as a first interlayer insulating film 8 by the plasma CVD method using the TEOS gas.

Then, as the densifying process of the first interlayer insulating film 8, this first interlayer insulating film 8 is annealed at the temperature of 700° C. for 30 minutes in the nitrogen atmosphere at the normal pressure, for example. Then, an upper surface of the first interlayer insulating film 8 is planarized by the chemical mechanical polishing (CMP) method.

Figure 2B:
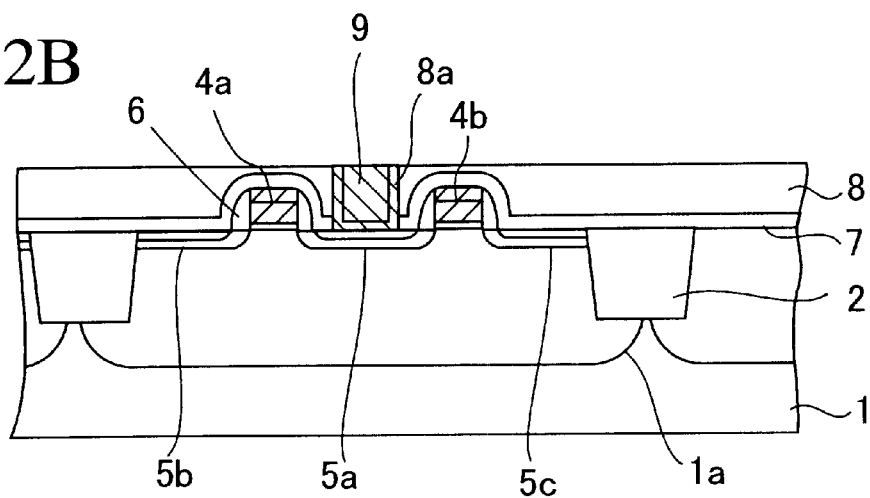

Next, steps required until a structure shown in FIG. 2B is formed will be explained hereunder.

First, a first contact hole 8a that has a depth reaching the first impurity diffusion region 5a is formed by patterning the cover insulating film 7 and the first interlayer insulating film 8 by means of the photolithography method. Then, a titanium (Ti) film of 30 nm thickness and a titanium oxide (TiN) film of 50 nm thickness are formed sequentially as a glue film on the first interlayer insulating film 8 and in the first contact hole 8a by the sputter method. Then, the inside of the first contact hole 8a is buried perfectly by growing a tungsten (W) film on the TiN film by virtue of the CVD method using $WF_6$.

Then, the W film, the TiN film, and the Ti film are removed from an upper surface of the first interlayer insulating film 8 by polishing them by virtue of the CMP method. The tungsten film, the TiN film, and the Ti film being left in the first contact hole 8a are used as a first conductive plug 9.

Figure 2C:
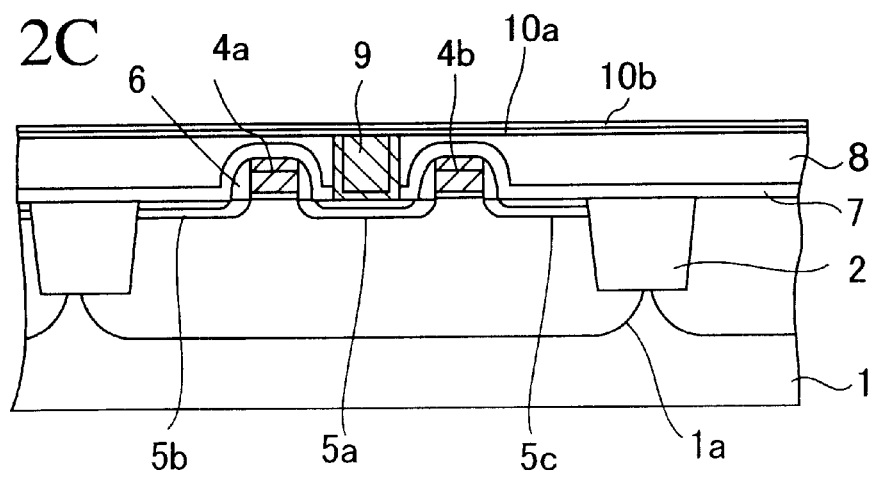

Then, as shown in FIG. 2C, an oxidation preventing film 10a made of silicon nitride ($Si_3N_4$) having a thickness of 100 nm and an underlying insulating film 10b made of $SiO_2$ having a thickness of 100 nm are formed sequentially on the first interlayer insulating film 8 and the first conductive plug 9 by the plasma CVD method. The $SiO_2$ film 10b is grown by the plasma CVD method using TEOS. The oxidation preventing film 10a is formed to prevent the situation that the first conductive plug 9 is abnormally oxidized in the thermal process such as the later annealing, etc. to cause the contact failure. It is preferable that its thickness should be set to more than 70 nm, for example.

Figure 2D:
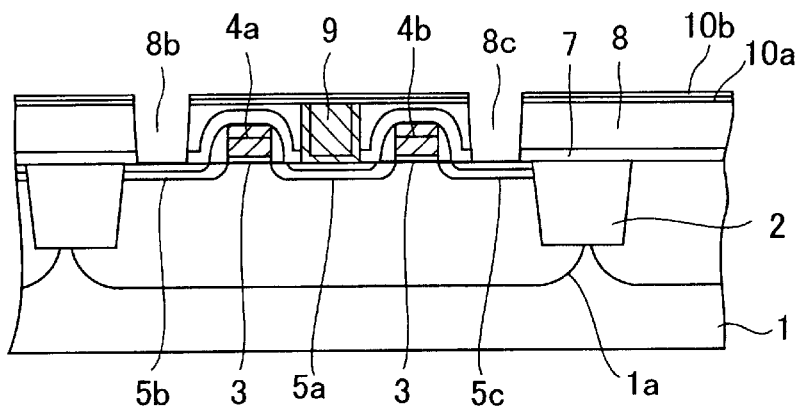

Then, as shown in FIG. 2D, second and third contact holes 8b, 8c are formed on the second and third impurity diffusion regions 5b, 5c by etching the oxidation preventing film 10a, the underlying insulating film 10b, and the first interlayer insulating film 8 while using a resist pattern (not shown).

Then, a Ti film of 30 nm thickness and a TiN film of 50 nm thickness are formed sequentially as a glue film on the underlying insulating film 10b and the second and third contact holes 8b, 8c by the sputter method. Then, insides of the second and third contact holes 8b, 8c are buried perfectly by growing a W film on the TiN film by virtue of the CVD method.

Figure 2E:
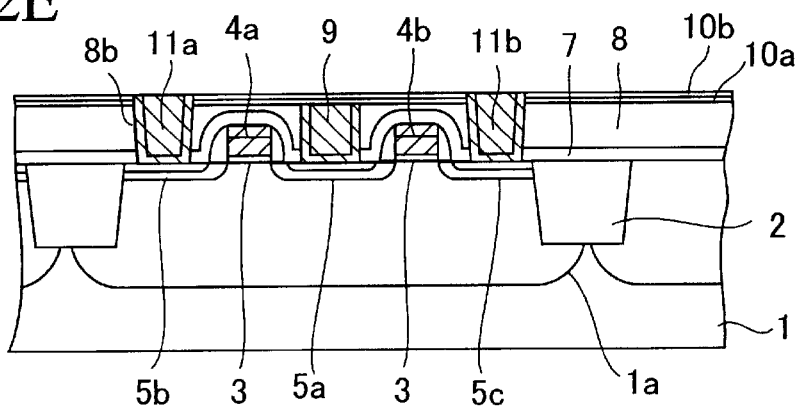

Then, as shown in FIG. 2E, the W film, the TiN film, and the Ti film are polished by the CMP method to remove from an upper surface of the underlying insulating film 10b. Thus, the tungsten film, the TiN film, and the Ti film left in the second and third contact holes 8b, 8c are used as second and third conductive plugs 11a, 11b respectively.

Figure 2F:
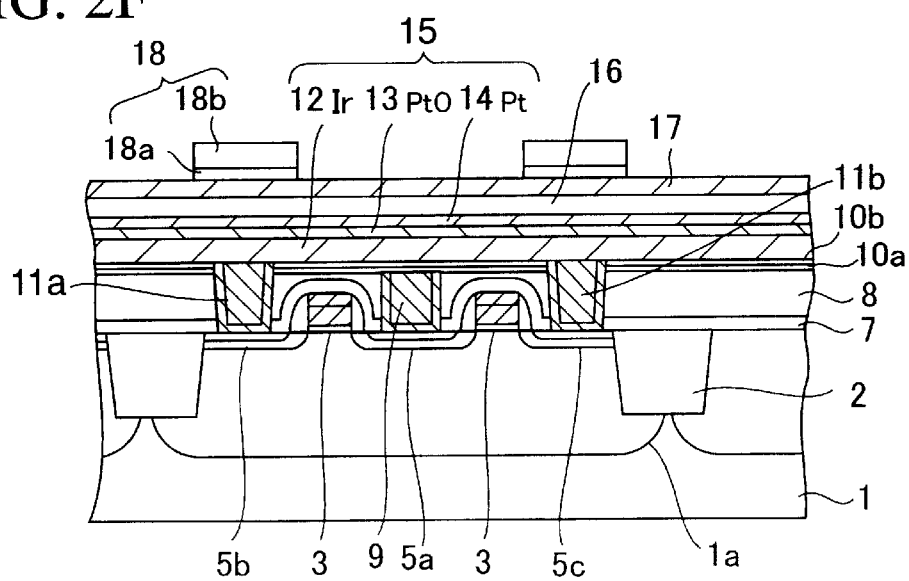

Next, steps required until a structure shown in FIG. 2F is formed will be explained hereunder.

First, an iridium (Ir) film 12 of 200 nm thickness, for example, is formed on the second and third conductive plugs 11a, 11b and the underlying insulating film 10b by the sputter method. Then, a platinum oxide (PtO) film 13 of 23 nm thickness, for example, is formed on the iridium film 12 by the sputter method. Then, a platinum (Pt) film 14 of 50 nm thickness, for example, is formed on the platinum oxide film 13 by the sputter method.

The Ir film 12, the PtO film 13, and the Pt film 14 constitute a first conductive film 15 having a multi-layered structure. In this case, the underlying insulating film 10b is annealed before or after the formation of the first conductive film 15 to prevent the peeling-off of the film, for example. As the annealing method, for example, RTA (Rapid Thermal Annealing) that executes the annealing at 600 to 750° C. in the argon atmosphere is employed.

Then, a PZT film of 200 nm thickness, for example, is formed on the first conductive film 15 as a ferroelectric film 16 by the sputter method. As the method of forming the ferroelectric film 16, in addition to this method, there are the MOD (Metal Organic Deposition) method, the MOCVD (Metal Organic CVD) method, the sol-gel method, etc. Also, as the material of the ferroelectric film 16, in addition to PZT, other PZT material such as PLCSZT, PLZT, etc., the Bi-layer structure compound material such as $SrBi_2Ta_2O_9$, $SrBi_2(Ta,Nb)_2O_9$, etc., and other metal oxide ferroelectric substance may be employed.

Then, the ferroelectric film 16 is crystallized by executing the annealing in the oxygen atmosphere. As the annealing, two-step RTA process having a first step, which executes the annealing in the argon-oxygen mixed gas atmosphere at the substrate temperature of 600° C. for 90 seconds, and a second step, which executes the annealing in the oxygen gas atmosphere at the substrate temperature of 750° C. for 60 seconds, for example, is employed.

Then, an iridium oxide ($IrO_2$) film of 200 nm thickness, for example, is formed on the ferroelectric film 16 as a second conductive film 17 by the sputter method. In the growth of the iridium oxide film, the sputter power is set to 1 kW and the argon and the oxygen are supplied to the growth atmosphere respectively.

Then, TiN films 18a and $SiO_2$ film 18b are formed sequentially on the second conductive film 17 as hard masks 18. The $SiO_2$ film 18b is formed by the plasma CVD method that uses TEOS as a source. This hard masks 18 are patterned by the photolithography method to have the capacitor planar shapes over the second and third conductive plugs 11a, 11b.

Figure 2G:
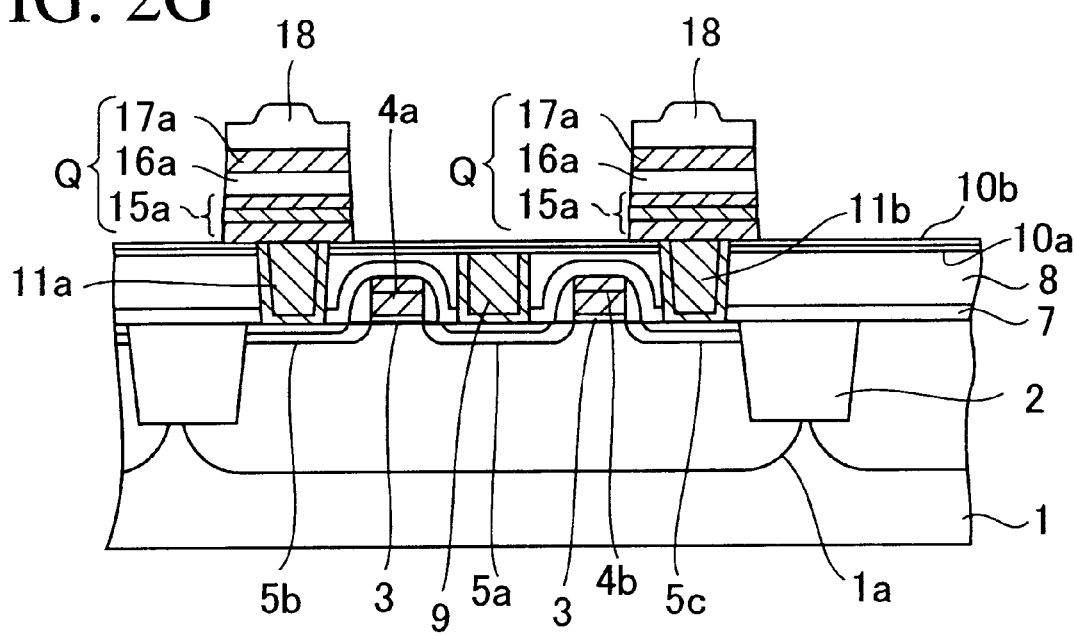

Then, as shown in FIG. 2G, the second conductive film 17, the ferroelectric film 16, and the first conductive film 15 located in the region that is not covered with the hard mask 18 are etched sequentially. In this case, the ferroelectric film 16 is etched in the atmosphere containing the chlorine and the argon by the sputter reaction. Also, the second conductive film 17 and the first conductive film 15 are etched by the sputter reaction in the atmosphere into which bromine ($Br_2$) is introduced, the Br-containing atmosphere, or the atmosphere into which only HBr and oxygen are introduced.

According to the above, lower electrodes 15a of capacitors Q formed of the first conductive film 15, dielectric films 16a of the capacitors Q formed of the ferroelectric film 16, upper electrodes 17a of the capacitors Q formed of the second conductive film 17 are formed on the oxidation preventing insulating film 10a. Then, in one transistor forming region, one lower electrode 15a is connected electrically to the second impurity diffusion region 5b via the second conductive plug 11a, and the other lower electrode 15a is connected electrically to the third impurity diffusion region 5c via the third conductive plug 11b.

Then, the hard mask 18 is removed. In this case, the oxide film etcher is employed to remove the silicon oxide film constituting the hard mask 18, and the TiN film is removed by the dry process using the down-flow asher or the wet process using ammonia peroxide.

Then, in order to recover the damage of the ferroelectric film 16 by the etching, the recovery annealing is carried out. The recovery annealing in this case is carried out in the oxygen atmosphere at the substrate temperature of 650° C. for 60 minutes.

Figure 2H:
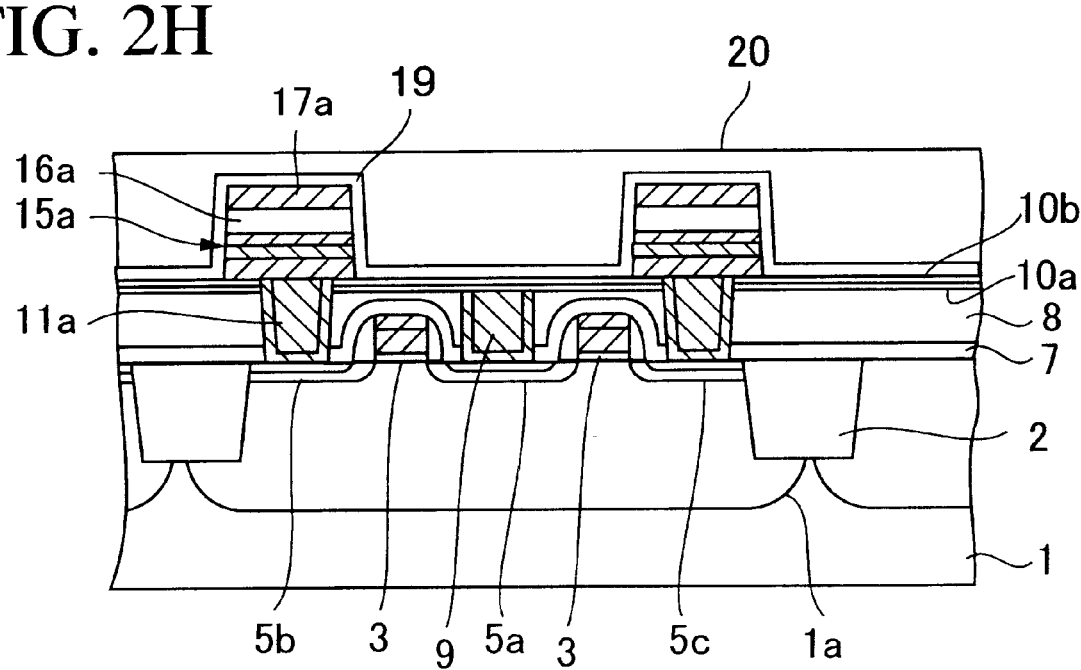

Then, as shown in FIG. 2H, an alumina film of 50 nm thickness is formed on the underlying insulating film 10b as a protection film 19, which covers the capacitors Q, by the sputter, and then the capacitors Q are annealed in the oxygen atmosphere at 650° C. for 60 minutes. This protection film 19 protects the capacitors Q from the process damage.

Then, a silicon oxide ($SiO_2$) film of about 1.0 μm thickness is formed on the protection film 19 as a second interlayer insulating film 20 by the plasma CVD method using the TEOS gas. In addition, an upper surface of the second interlayer insulating film 20 is planarized by the CMP method. In this example, a remaining thickness of the second interlayer insulating film 20 after the CMP is set to about 300 nm on the upper electrodes 17a of the capacitors Q.

Figure 2I:
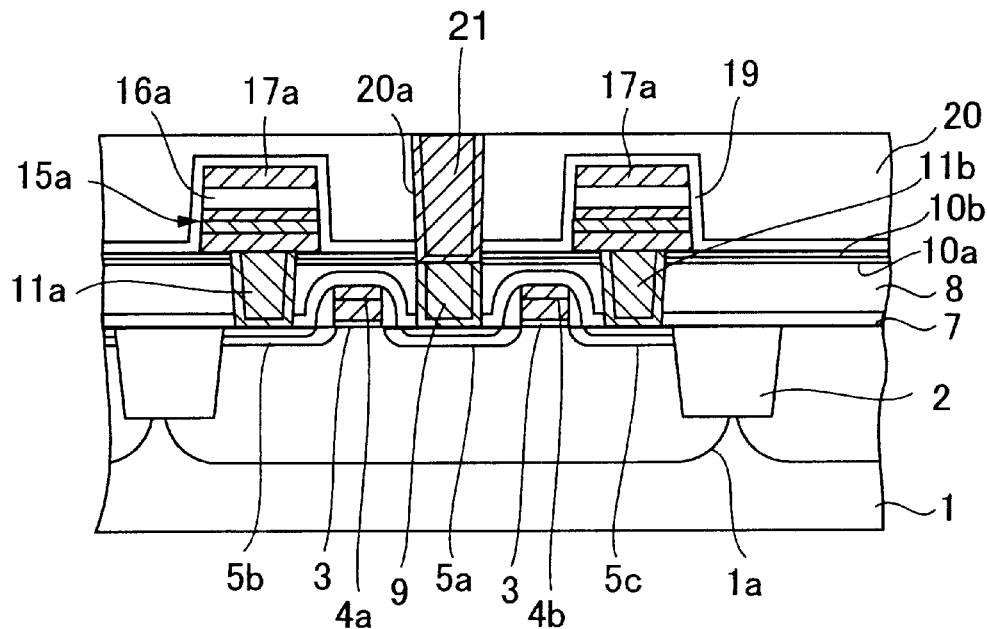

Then, as shown in FIG. 2I, a hole 20a is formed on the first conductive plug 9 by etching the second interlayer insulating film 20, the protection film 19, the oxidation preventing insulating film 10a, and the underlying insulating film 10b while using a resist mask (not shown).

Then, a Ti film of 30 nm thickness and a TiN film of 50 nm thickness are formed sequentially in the hole 20a and on the second interlayer insulating film 20 as a glue film by the sputter method. Then, a W film is grown on the glue film by the CVD method to bury an inside of the hole 20a perfectly.

Then, the W film, the TiN film, and the Ti film are polished by the CMP method to remove from an upper surface of the second interlayer insulating film 20. Then, the tungsten film and the glue film being left in the hole 20a are used as a fourth conductive plug 21. This fourth conductive plug 21 is connected electrically to the first impurity diffusion region 5a via the first conductive plug 9.

Figure 2J:
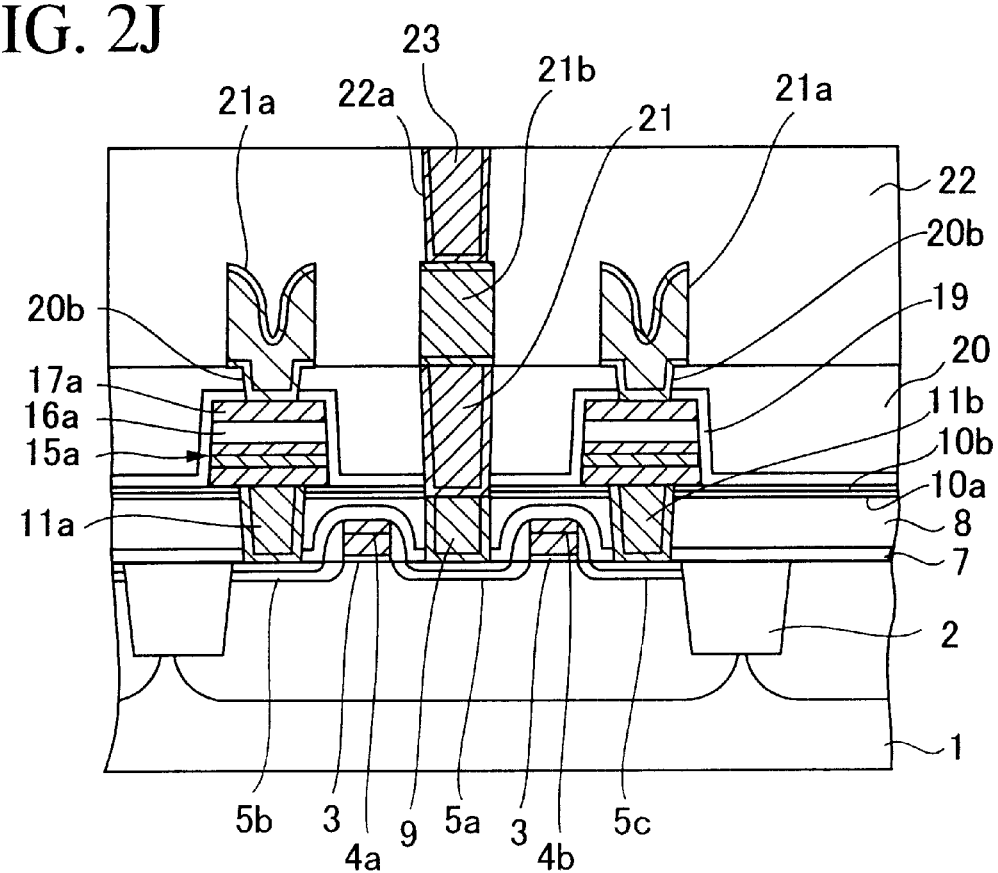

Next, steps required until a structure shown in FIG. 2J is formed will be explained hereunder.

First, an SiON film is formed on the fourth conductive plug 21 and the second interlayer insulating film 20 as a second oxidation preventing film (not shown) by the CVD method. Then, contact holes 20b are formed on the upper electrodes 17a of the capacitors Q by patterning the second oxidation preventing film and the second interlayer insulating film 20 by virtue of the photolithography method.

The capacitors Q that are subjected to the damage by forming the contact holes 20b are recovered by the annealing. This annealing is carried out in the oxygen atmosphere at the substrate temperature of 550° C. for 60 minutes, for example.

Then, the oxidation preventing film formed on the second interlayer insulating film 20 is removed by the etching back to expose a surface of the fourth conductive plug 21.

Then, a multi-layered metal film is formed in the contact holes 20b formed on the upper electrodes 17a of the capacitors Q and on the second interlayer insulating film 20. Then, first-layer metal wirings 21a, which are connected to the upper electrodes 17a via the contact holes 20b, and a conductive pad 21b, which is connected to the fourth conductive plug 21, are formed by patterning the multi-layered metal film. As the multi-layered metal film, a structure which is constructed by forming sequentially a Ti film of 60 nm thickness, a TiN film of 30 nm thickness, an Al—Cu film of 400 nm thickness, a Ti film of 5 nm thickness, and a TiN film of 70 nm thickness, for example, is employed.

As the patterning method of the multi-layered metal film, the method of forming a reflection preventing film (not shown) on the multi-layered metal film, then coating a resist on the reflection preventing film, then forming resist patterns such as the wiring shape, etc. by exposing/developing the resist, and then etching the reflection preventing film and the multi-layered metal film by using the resist is employed. In this case, after the patterning of the multi-layered metal film, the reflection preventing film may be removed or be left as it is.

Then, a third interlayer insulating film 22 is formed on the second interlayer insulating film 20, the first-layer metal wirings 21a, and the conductive pad 21b. Then, a hole 22a is formed on the conductive pad 21b by patterning the third interlayer insulating film 22, and then a fifth conductive plug 23 that consists sequentially of a TiN film and a W film from the bottom is formed in the hole 22a. Then, although not shown particularly, a second-layer wiring containing the bit line is formed on the third interlayer insulating film 22. The bit line is connected electrically to the first impurity diffusion region 5a via the fifth conductive plug 23, the conductive pad 21b, the fourth conductive plug 21, and the first conductive plug 9. In turn, an insulating film for covering the second-layer wiring, etc. are formed, but the explanation of their details is omitted.

The above steps are the steps of forming the memory cell region of the FeRAM.

Next, the etching of the first conductive film 15, the ferroelectric film 16, and the second conductive film 17 constituting the capacitor will be explained in detail hereunder.

In order to bring an angle of side surfaces, which are exposed by the etching, (etching side surfaces) of the first conductive film 15, the ferroelectric film 16, and the second conductive film 17 to the upper surface of the underlying insulating film 10b close to a right angle, it is effective to enhance the chemical reactivity between the etching gas and the etched material.

Because the volatile substance is generated by the chemical reaction between the etching gas and the etched material in the plasma and then exhausted, such etched material is etched. In this case, since the volatile reaction product is not deposited onto the etching side surfaces but exhausted, the etched shape that is close to the perpendicular shape can be obtained.

In contrast, if the etching using the sputter action is employed, the etching product is deposited onto the etching side surfaces and acts as a mask, so that it is difficult to form the etching side surfaces as the perpendicular shape. In addition, if it is tried to bring the etching side surfaces close to the perpendicular shape, the conductive deposition substance (fence) is formed on the etching side surfaces to lower extremely the capacitor characteristics.

Thus, in order to etch the ferroelectric material film and the electrode material film without the formation of the fence, it is important to enhance the chemical reactivity between the etching gas and the etched material by setting the wafer stage to the high temperature, or the like. If the wafer stage is set to the high temperature, the material except the photoresist must be used as the mask material because the photoresist lacks the heat resistance.

First, the etching equipment used to pattern the films constituting the capacitor will be explained with reference to FIG. 6 hereunder.

The equipment shown in FIG. 3 is the ICP plasma etching equipment.

In FIG. 3, a wafer stage 32 is arranged in a low pressure chamber 31. This wafer stage 32 has a structure in which an electrostatic chuck 32b is installed on a heater 32a, and a first high frequency power supply 33 is connected to the electrostatic chuck 32b.

Also, an almost cylindrical adhesion preventing plate 34 is arranged in the low pressure chamber 31 to surround the wafer stage 32, and an upper portion of the adhesion preventing plate 34 is closed by a quartz plate 34a. Also, an antenna coil 36 connected to a second high frequency power supply 35 is fitted onto the quartz plate 34a. The plasma is generated in the adhesion preventing plate 34 by applying the high frequency power to the antenna coil 36. A gas introducing pipe 40 is connected to the etching atmosphere that is surrounded by the adhesion preventing plate 34 and the quartz plate 34a. Thus, in the etching steps shown in FIG. 2F and FIG. 2G, gases that are suitable for respective etchings of the first conductive film 15, the ferroelectric film 16, and the second conductive film 17 are introduced. In this case, as the material constituting the first conductive film 15 and the second conductive film 17, the noble metal such as Ir, Pt, etc., which is stable chemically, its oxide, or the like are employed.

In addition, an exhaust pipe 31a is connected to the low pressure chamber 31, and an opening 34b is formed in the portion of the adhesion preventing plate 34, which is close to the exhaust pipe 31a. A load lock chamber 38 is positioned adjacently to the low pressure chamber 31 via a gate valve 37. Then, a wafer loading port 34d that is opened/closed by a shutter 34c is formed in the portion of the adhesion preventing plate 34, which is positioned close to the load lock chamber 38.

Next, the etching of the electrode material film and the ferroelectric film using such etching equipment will be explained hereunder.

(Etching of the Electrode Material Film)

First, a relationship between an etching rate and a temperature was examined by etching the iridium (Ir) film used as the electrode material. The temperature of the wafer stage 32 was changed in the range of 250° C. to 400° C. under the etching conditions that the pressure in the etching atmosphere was set to 0.5 Pa, the source power from the second high frequency power supply 35 to the antenna coil 36 was set to 800 watt, and the bias power from the first high frequency power supply 33 was set to 300 watt.

Figure 4:
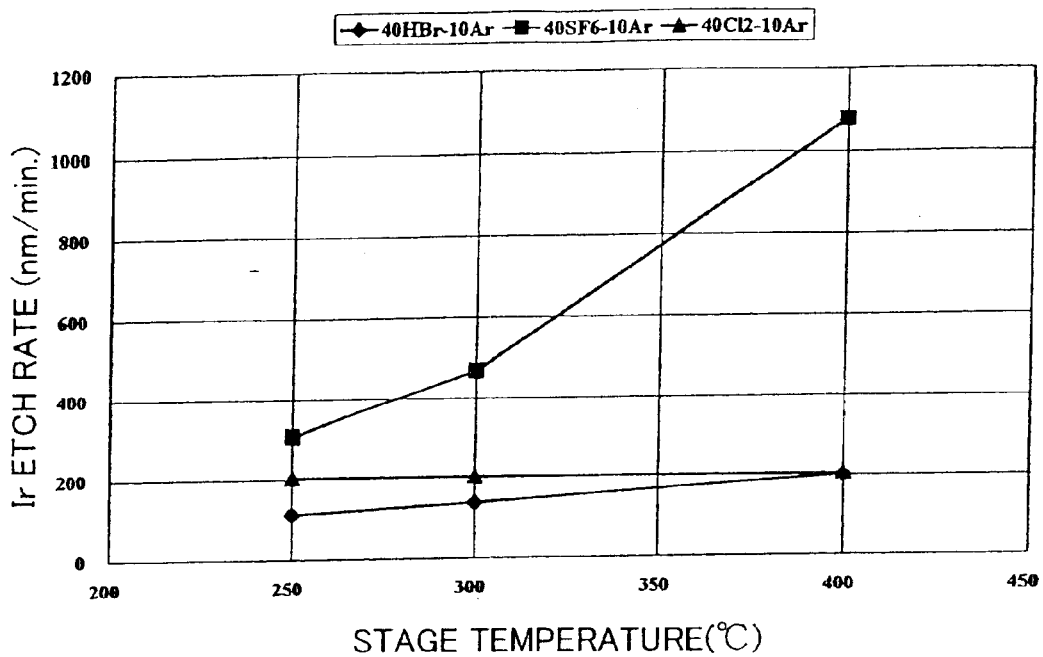
FIG. 4 is a view showing a relationship between an etching rate of iridium used in a capacitor electrode of the semiconductor device according to the embodiment of the present invention and a stage temperature.

In FIG. 4, dependencies of the Ir film etching rate on the stage temperature are shown when gases containing halogen, i.e., the mixed gas of HBr and Ar, the mixed gas of $SF_6$ and Ar, and the mixed gas of $Cl_2$ and Ar, are used respectively.

The etching rates of HBr and $SF_6$ had the temperature dependency, but the etching rates of $Cl_2$ had no temperature dependency. Accordingly, it is possible to say that the improvement of the chemical reactivity of $Cl_2$ cannot be expected if the wafer stage 32 is set to the high temperature, but the chemical reactivity of $SF_6$ or HBr can be improved if the wafer stage 32 is set to the high temperature.

However, since $SF_6$ has the too strong reactivity, the hard mask 18 shown in FIG. 2F is etched and is not held and also it is difficult to control stably its etching rate.

As a result, if the wafer stage 32 is set to the high temperature of 300° C. or more by using HBr, the film of the noble metal such as Ir, Pt, etc. or its oxide can be etched into the almost perpendicular shape by the chemical reaction.

The etching shapes of the Ir film, the IrOx film, and the Pt film were examined by changing the temperature of the wafer stage 32 in the temperature range of 250° C. to 600° C. by using HBr. As the result, the etching shape of the noble metal or its oxide, which is closer to the perpendicular shape than the prior art, could be obtained irrespective of the difference of the material by executing the etching in the temperature range of 300° C. to 600° C. by using HBr.

By the way, since the hydrogen constituting HBr is reductive, HBr degrades the ferroelectric film such as PZT, etc. and thus the desired capacitor characteristics cannot be attained. Therefore, $O_2$ as well as HBr is introduced simultaneously into the etching atmosphere. In other words, the influence of the hydrogen can be removed by reacting the hydrogen with the oxygen to generate the water. Since the water has a low boiling point and is easily volatilized by setting its temperature to the high temperature in the low pressure, the hydrogen is difficult to enter into the ferroelectric capacitor during the etching.

Next, when the completed ferroelectric capacitor was prepared as the characteristic measuring sample and also performances of the capacitor were examined by exposing the sample to the HBr plasma on the wafer stage 32 at 400° C., results shown in FIG. 8 were obtained. In this examination, a polarization charge amount $Q_{SW}$ of the sample capacitor was examined by changing the density of the oxygen being supplied to the adhesion preventing plate 34 from 0% to 50% under the conditions that the pressure in the etching atmosphere was set to 0.5 Pa, the source power from the second high frequency power supply 35 to the antenna coil 36 was set to 800 watt, and the bias power from the first high frequency power supply 33 to the electrostatic chuck 32b was set to 0 watt.

Figure 5:
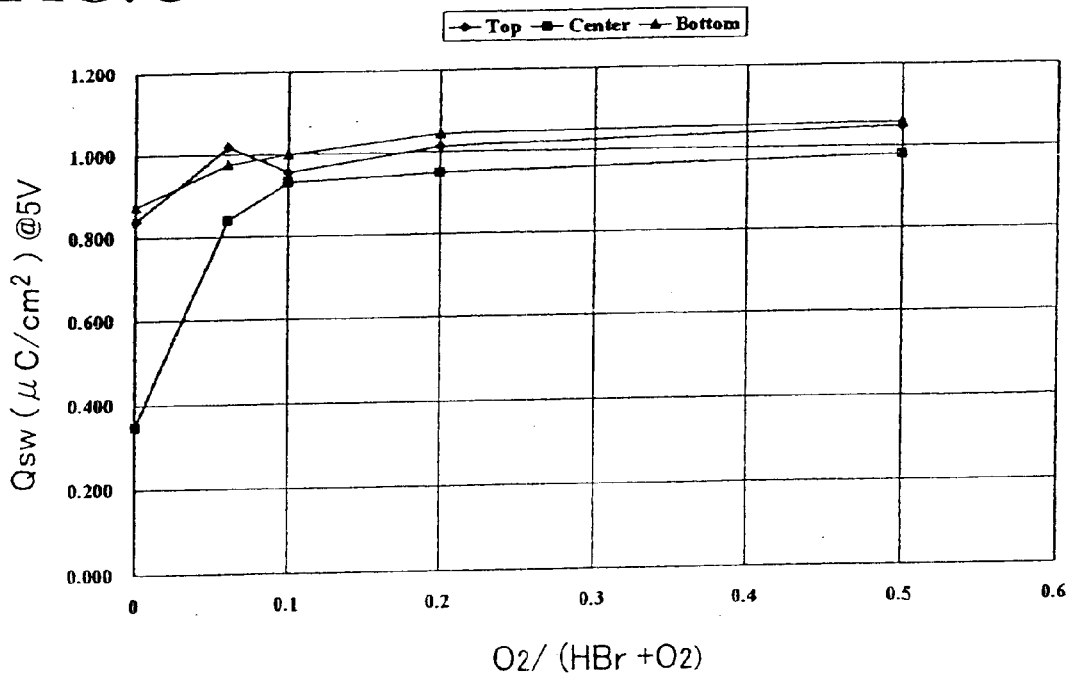
FIG. 5 is a view showing a relationship between a polarization charge amount and an oxygen density when the capacitor of the semiconductor device according to the embodiment of the present invention is exposed to a mixed gas plasma consisting of HBr and oxygen.

According to FIG. 5, it is found that, if $O_2$ is added by 10% or more, the degradation of the capacitor can be suppressed. The polarization charge amount $Q_{SW}$ shown in FIG. 5 was obtained by setting the voltage applied to the capacitor to ±5 V. In FIG. 5, "Top", "Center", and "Bottom" indicate the position of the semiconductor wafer respectively when the orient flat of the semiconductor wafer on which a plurality of capacitors are formed is directed downwardly.

Figure 6:
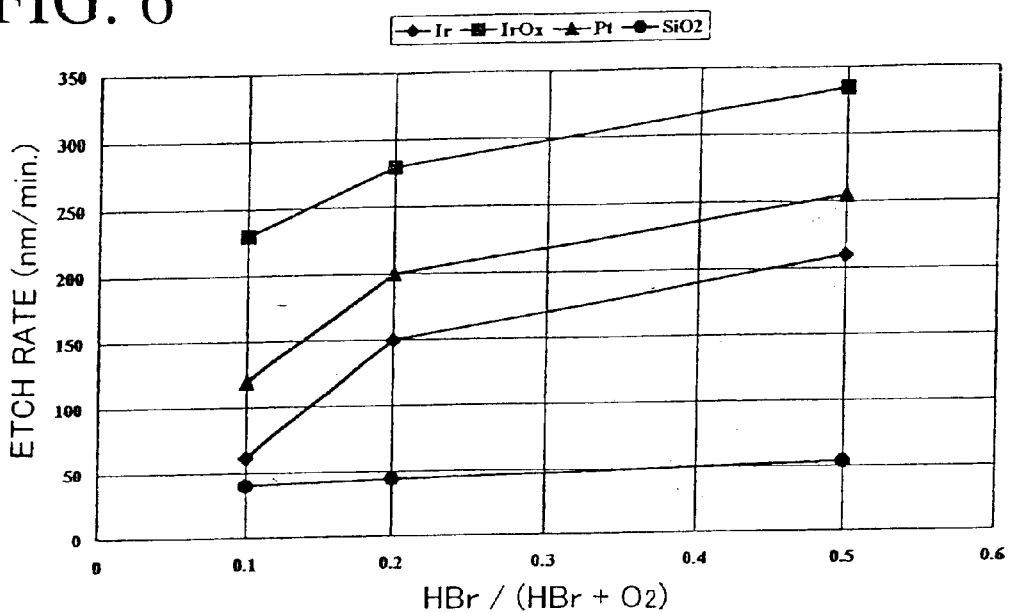
FIG. 6 is a view showing a relationship between an etching rate and a HBr density when an iridium film, an iridium oxide film, and a platinum film used in the capacitor electrode of the semiconductor device according to the embodiment of the present invention and a silicon oxide film used as an insulating film are etched by the mixed gas plasma consisting of HBr and oxygen respectively.

Next, when the etching rate was measured by changing the density of $O_2$ in the mixed gas consisting of HBr and $O_2$, experimental results shown in FIG. 6 were obtained. According to FIG. 6, even if the $O_2$ density was set to more than 80%, the sufficient etching rates of the Ir film, the IrOx film, and the Pt film could be obtained and thus the anticipated extreme reduction in the etching rate did not appear. Accordingly, it is found that the mixed gas consisting of HBr and $O_2$ has the sufficient capability as the etchant of the noble metal and its oxide. In addition, although not shown in FIG. 6, even when the wafer heating temperature was set to 700° C., the sufficient etching rate was obtained. In this case, the etching rate of $SiO_2$ was slightly increased.

The experiment shown in FIG. 6 was executed by changing the $O_2$ density in the HBr—$O_2$ gas supplied into the adhesion preventing plate 34 from 50% to 90% under the conditions that the pressure in the cylindrical adhesion preventing plate 34 was set to 0.5 Pa, the source power from the second high frequency power supply 35 to the antenna coil 36 was set to 800 watt, and the bias power from the first high frequency power supply 33 was set to 300 watt.

Figure 7:
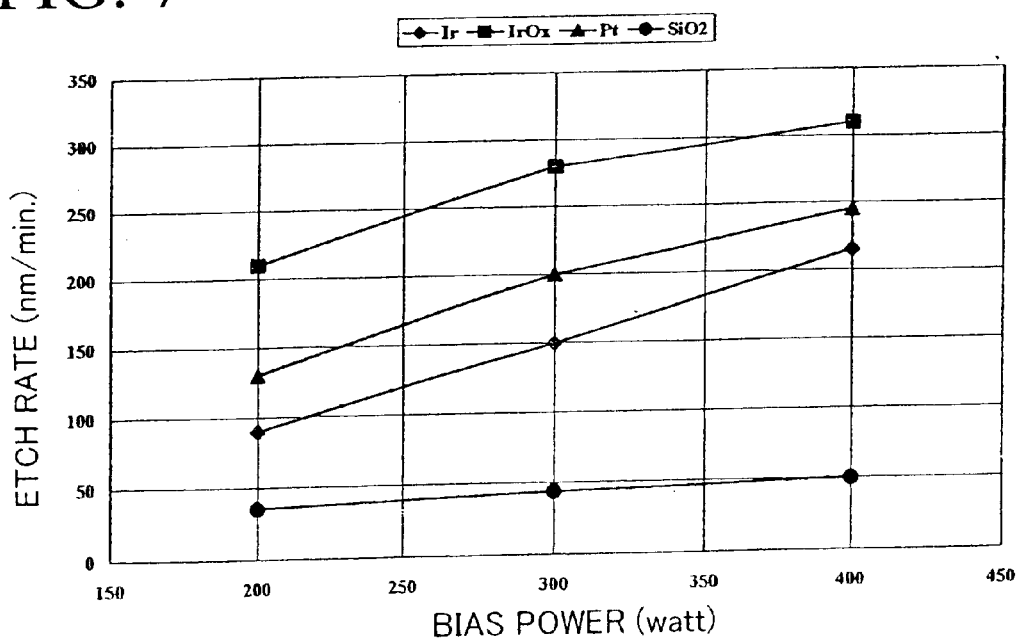
FIG. 7 is a view showing a relationship between an etching rate and a bias power when an iridium film, an iridium oxide film, and a platinum film used in the capacitor electrode of the semiconductor device according to the embodiment of the present invention and a silicon oxide film used as an insulating film are etched by the mixed gas plasma consisting of HBr and oxygen respectively.

Next, when the etching rates of the Ir film, the IrOx film, the Pt film, and the $SiO_2$ film were examined by changing the bias power while fixing the $O_2$ density in the HBr—$O_2$ plasma to 80%, results shown in FIG. 7 were obtained.

According to FIG. 7, the etching rates of the Ir film, the IrOx film, and the Pt film could be improved by increasing the bias power, but the increase in the etching rate of the silicon oxide ($SiO_2$) film with the increase of the bias power was not prominent rather than the Ir film, the IrOx film, and the Pt film. In the normal etching not using HBr and $O_2$, if the bias power is increased, the selective etching ratio of the conductive film to the silicon oxide film is remarkably lowered.

As a result, the selective etching ratio to the silicon oxide film could be improved by increasing the bias power, which is the feature of the high temperature etching.

In the etching rate measuring experiment, the bias power from the first high frequency power supply 33 was changed from 200 watt to 400 watt under the conditions that the pressure in the etching atmosphere was set to 0.5 Pa, the source power from the second high frequency power supply 35 to the antenna coil 36 was set to 800 watt, and the $O_2$ density in the HBr—$O_2$ mixed gas supplied to the cylindrical adhesion preventing plate 34 was set to 80%.

According to the above experimental results, it is found that the high-speed and high-selective etching of the noble metal or its oxide can be attained by adjusting the substrate temperature, the bias power, the gas mixture ratio, etc. while using the mixed gas consisting of HBr and $O_2$.

In other words, the $O_2$ density in the HBr—$O_2$ mixed gas must be set to at least 10% from a viewpoint of suppressing the degradation of the capacitor performances. In addition, it is preferable from a viewpoint of the etching rate that the $O_2$ density should be set to less than 90%. Further, if the temperature of the wafer stage 32 is set to the high temperature in excess of 300° C. while using the gas containing HBr and $O_2$, it is possible to etch the noble metal such as Ir, Pt, etc. or its oxide, which is used as the electrode material of the ferroelectric capacitor and the high-dielectric capacitor, at the high etching rate selectively from $SiO_2$ constituting the underlying insulating film 10b.

Next, the patterning of the electrode material film under the etching conditions being set based on the above experimental results will be explained hereunder.

First, in the patterning steps shown in FIG. 2F and FIG. 2G, the HBr—Ar gas was used in etching the second conductive film 17 constituting the upper electrode 17a, and the $Cl_2$—Ar gas was used in etching the PZT film 16 constituting the dielectric film 16a. Also, the HBr—$O_2$ gas was used in etching the first conductive film 15 constituting the lower electrode 15a.

Here, the etching was executed by changing the density of the oxygen, which was introduced in etching the first conductive film 15, from 20% to 90% while fixing the etching conditions of the second conductive film 17 and the PZT film 16. Also, the hard mask having the capacitor planar shape was used in the etching.

According to the experiment, results shown in FIGS. 8A to 8D were obtained.

Figure 8A:
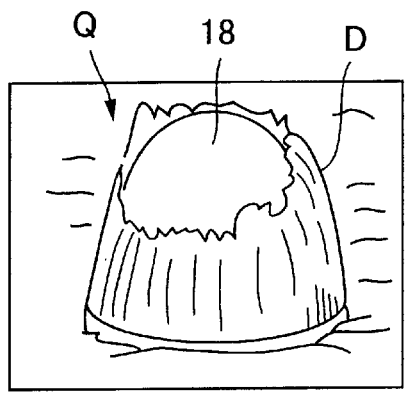
FIGS. 8A to 8D are perspective views, illustrated based on microphotographs, showing adhesion states of a conductive fence onto a capacitor side surface in response to changes of an $O_2$ density in the HBr—$O_2$ mixed gas used to form a capacitor lower electrode of the semiconductor device according to the embodiment of the present invention.

FIG. 8A shows the state after the lower electrode 15a was formed by etching the first conductive film 15 using the HBr—$O_2$ mixed gas whose oxygen density is 20%. According to this, the deposition D was adhered onto the side wall of the capacitor Q.

Figure 8B:
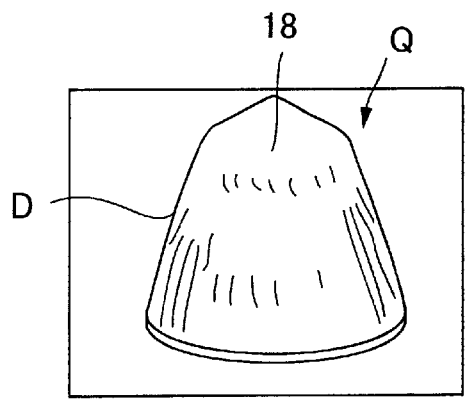

FIG. 8B shows the state after the lower electrode 15a was formed by etching the first conductive film 15 using the HBr—$O_2$ mixed gas whose oxygen density is 50%. According to this, the deposition D was also adhered onto the side wall of the capacitor Q.

Figure 8C:
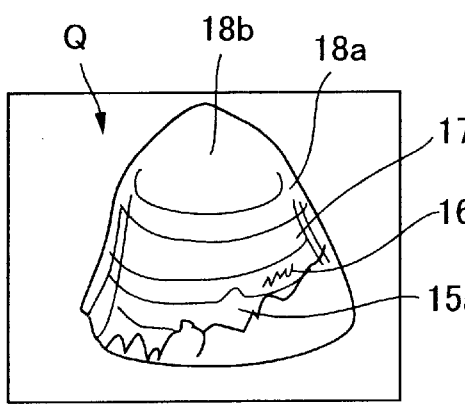
Figure 8D:
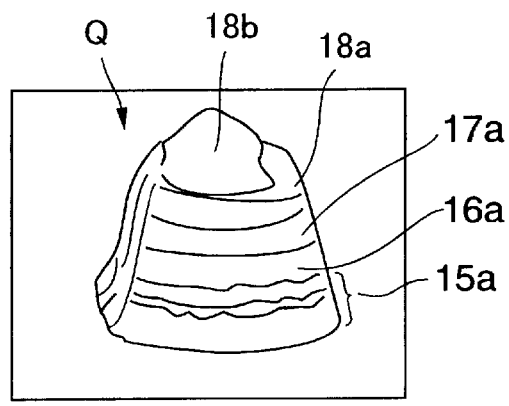

FIGS. 8C and 8D show the states after the lower electrode 15a was formed by etching the first conductive film 15 using the HBr—$O_2$ mixed gas whose oxygen density is 80% and 90% respectively. According to this, the generation of the deposition was not found on the side walls of the capacitor.

As a result, it is found that the deposition being adhered onto the side walls of the capacitor can be suppressed by increasing the oxygen density.

As the $O_2$ density in the HBr—$O_2$ mixed gas, at least 10% is required from a viewpoint of the suppression of the degradation in the capacitor performance. However, 80% or more is required from a viewpoint of the suppression of the adhesion of the side wall deposition. In addition, as shown in FIG. 6, it is preferable from a viewpoint of the etching rate that the $O_2$ density should be set to less than 90%.

Therefore, the oxygen density of 80% to 90% in the HBr—$O_2$ mixed gas is suitable. Also, if the gas containing HBr and $O_2$ is used and the stage temperature is set to the high temperature of more than 300° C., the film made of the noble metal such as Ir, Pt, etc. or its oxide, which is used as the electrode material of the ferroelectric capacitor and the high-dielectric capacitor, can be etched into the almost perpendicular shape without the formation of the fence on the side wall of the capacitor.

Meanwhile, the etching of the electrode material using the gas containing $Cl_2$ was also examined. The electrode material film could be etched by using the gas containing $Cl_2$, but the conductive fence was formed on the side surface of the capacitor in the etching of the Ir film or the IrOx film and also a great deal of granular products were generated in the etching of the Pt film.

Therefore, the $Cl_2$-containing gas is not suitable for the etching gas of the electrode material film. However, if the fence can be removed, the chlorine gas may be used.

Figure 9:
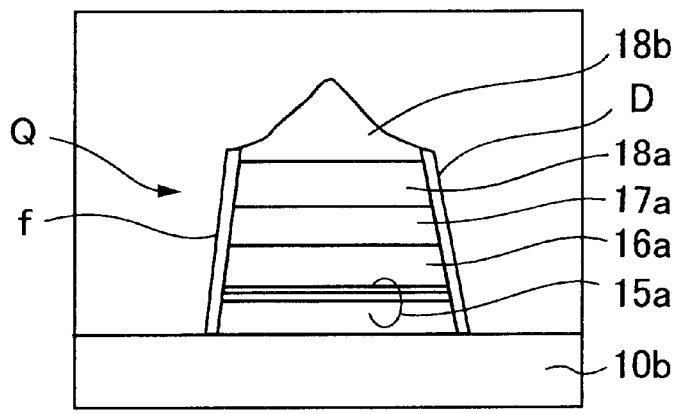
FIG. 9 is a sectional view showing a capacitor when a $Cl_2$—$O_2$ mixed gas is used to form the capacitor electrode of the semiconductor device according to the embodiment of the present invention.

FIG. 9 shows a sectional shape of the capacitor Q, which was obtained by etching the PZT film serving as the ferroelectric film 16 by the $Cl_2$—Ar mixed gas plasma and etching the first and second conductive films 15, 17 serving as the upper electrode 17a and the lower electrode 15a by the $Cl_2$—$O_2$ mixed gas plasma. According to FIG. 9, it can be watched that the conductive fence f is formed the side surface of the capacitor Q. In etching these conductive films 15, 17, $Cl_2$ and $O_2$ are introduced into the etching atmosphere at the flow rates of 10 sccm and 40 sccm respectively.

Figure 10:
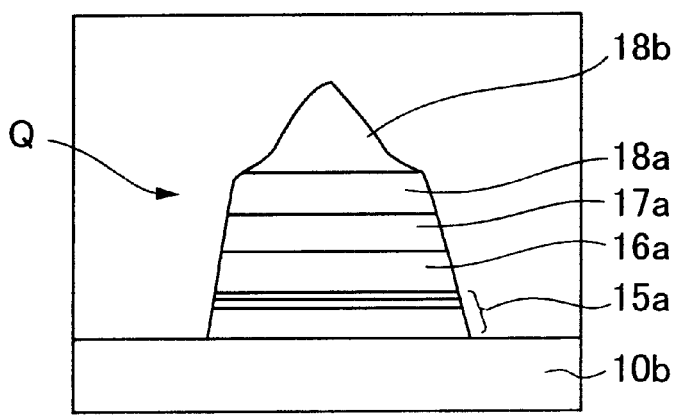
FIG. 10 is a sectional view showing a capacitor when the HBr—$O_2$ mixed gas is used to form the capacitor electrode of the semiconductor device according to the embodiment of the present invention.

FIG. 10 shows a sectional shape of the capacitor Q, which was obtained by etching the PZT film serving as the ferroelectric film 16 by the $Cl_2$—Ar mixed gas plasma and etching the first and second conductive films 15, 17 serving as the upper electrode 17a and the lower electrode 15a by the HBr—$O_2$ mixed gas plasma.

According to FIG. 10, no conductive fence was formed on the side surface of the capacitor Q. In etching these conductive films 15, 17, HBr and $O_2$ were introduced into the etching atmosphere at the flow rates of 10 sccm and 40 sccm respectively.

In this case, the fluorine gas is effective to remove the fence from the side surface of the capacitor Q. Therefore, the fluorine gas may be added to the gas containing HBr or $Cl_2$.

(Etching of the Ferroelectric Material Film)

Next, the patterning of the ferroelectric film constituting the capacitor will be explained hereunder.

When etching the ferroelectric material film constituting the capacitor, it is important it not only does not to form the fence on the side surfaces of the capacitor, but not to degrade the deterioration of the capacitor performances.

Figure 11:
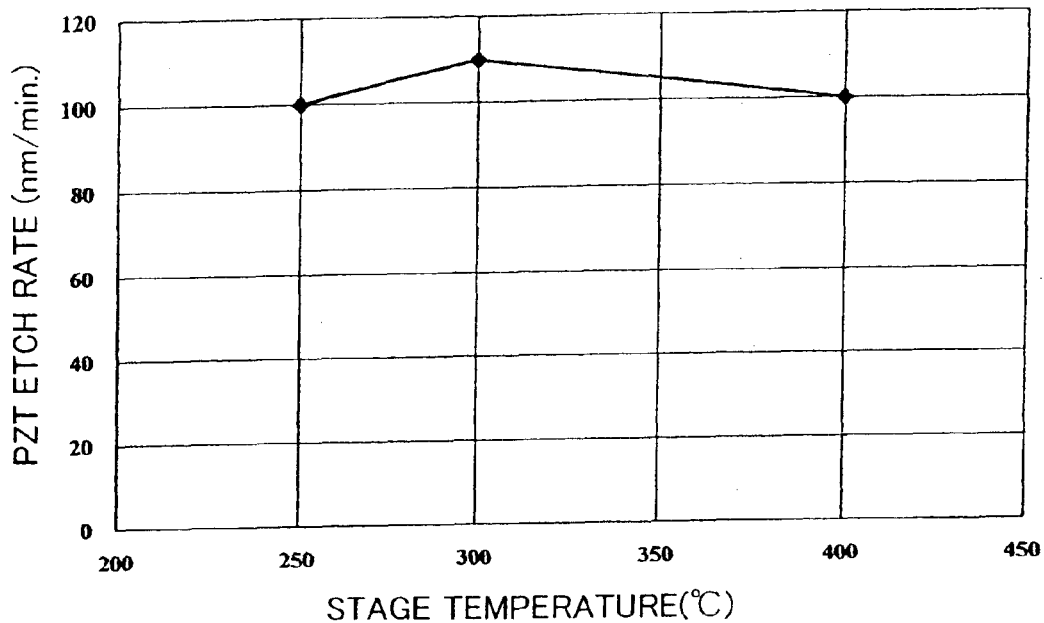
FIG. 11 is a sectional view showing a relationship between a stage temperature and an etching rate when a HBr—Ar mixed gas is used to etch a PZT film serving as a capacitor dielectric film of the semiconductor device according to the embodiment of the present invention.

First, when the dependency of the etching rate on the temperature was examined if the PZT film is etched by using the HBr—Ar mixed gas, results shown in FIG. 11 were obtained. It is found that the etching rate had no dependency on the temperature. Accordingly, most etching of the PZT film which used the HBr—Ar mixed gas originates in PVD of sputter.

As the etching equipment in such case, the ICP plasma etching equipment shown in FIG. 3 was used. In the experiment shown in FIG. 11, the wafer stage temperature was changed from 250° C. to 400° C. under the conditions that the pressure in the cylindrical adhesion preventing plate 34 was set to 0.5 Pa, the source power from the second high frequency power supply 35 to the antenna coil 36 was set to 800 watt, and the bias power from the first high frequency power supply 33 was set to 300 watt.

Figure 12:
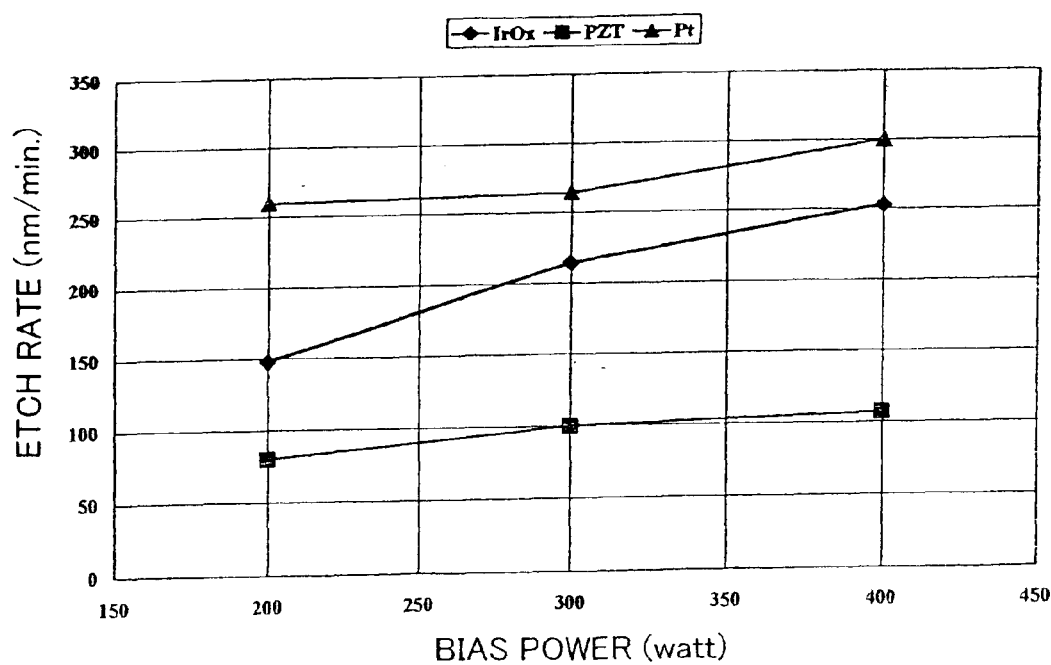
FIG. 12 is a view showing a relationship between a bias power and an etching rate when an iridium oxide film, a PZT film, and a platinum film used in the capacitor of the semiconductor device according to the embodiment of the present invention are etched by the HBr—Ar mixed gas respectively.

Next, experimental results of the dependencies of the etching rates of the $IrO_2$ film, the PZT film, and the Pt film on the bias power when the HBr—Ar mixed gas was used as the etching gas are shown in FIG. 12. According to FIG. 12, it is apparent that the etching rate of the PZT film by the HBr—Ar mixed gas plasma seldom depends on the bias power. In addition, the etching based on the chemical reaction is not expected in the etching of the PZT film by the HBr—Ar mixed gas plasma, and thus the high-speed etching cannot be executed even if the bias power, etc. are adjusted.

As the etching equipment in such case, the ICP plasma etching equipment shown in FIG. 3 was used. In the experiment shown in FIG. 12, the bias power from the first high frequency power supply 33 was changed from 200 watt to 400 watt under the conditions that the pressure in the cylindrical adhesion preventing plate 34 was set to 0.5 Pa, the source power from the second high frequency power supply 35 to the antenna coil 36 was set to 800 watt, and the wafer stage temperature was set to 400° C.

Figure 13:
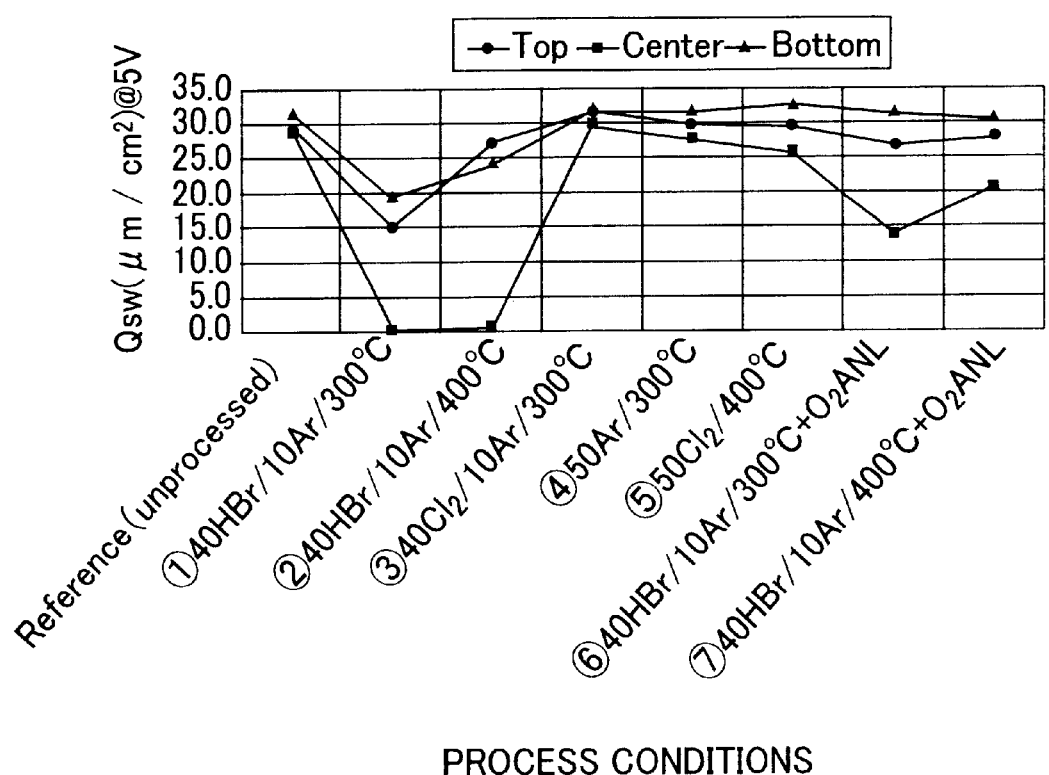
FIG. 13 is a view showing a relationship between a polarization charge amount and process conditions when the capacitor of the semiconductor device according to the embodiment of the present invention is exposed to various gas plasmas.

Next, when the completed ferroelectric capacitor was prepared as the characteristic measuring sample and also the polarization charge amount $Q_{SW}$ of the capacitor was examined by exposing the sample to various gas plasmas on the wafer stage 32 at 400° C., results shown in FIG. 13 were obtained. The polarization charge amount $Q_{SW}$ shown in FIG. 13 was obtained by setting the voltage applied to the capacitor to ±5 V. The etching equipment used in this examination was the ICP plasma etching equipment shown in FIG. 3.

In ① to ⑦ in FIG. 13, numerals given before HBr, Ar, and Cl denote the flow rate respectively, the temperature is the substrate temperature in the plasma, and $O_2$ANL denotes the oxygen annealing.

In this examination, the pressure in the etching atmosphere was set to 0.5 Pa, the source power from the second high frequency power supply 35 to the antenna coil 36 was set to 800 watt, and the bias power from the first high frequency power supply 33 to the electrostatic chuck, was set to 0 watt.

As shown in ① and ② of FIG. 13, performances of the capacitor that was exposed to the HBr gas plasma containing Ar were considerably deteriorated. Also, as shown in ⑥ and ⑦ of FIG. 13, the polarization charge amount $Q_{SW}$ of the capacitor was not be sufficiently recovered even if the capacitor being exposed to the HBr gas plasma containing Ar was annealed in the oxygen atmosphere later. However, as shown in ③ to ⑤ of FIG. 13, the performances of the capacitor being exposed to the $Cl_2$ plasma gas or the Ar plasma gas were seldom deteriorated. Also, the wafer stage temperature scarcely affected the degradation of the capacitor. Based on these results, the gas containing $Cl_2$ is suitable for the etching of the ferroelectric material film.

In the present embodiment, the etching rate of the PZT film by the plasma of the mixed gas of HBr and $O_2$, which is used in the etching of the electrode material film, is low. Also, since the etching rate of the PZT film does not become high if $O_2$ is added into the chlorine ($Cl_2$), it is preferable that the gas except the oxygen should be introduced in etching the ferroelectric film or the high-dielectric film.

Meanwhile, in FIG. 2F, the underlying film of the PZT film 16 as the ferroelectric material is the Pt film 14. The PZT film 16 is etched by using the gas containing $Cl_2$ as described above, the unevenness is present on a surface of the PZT film 16. For this reason, when the just-etching state of the PZT film 16 is detected by using the end point detecting device (EPD), the underlying Pt film 14 is brought into its considerably-etched state. As a result, a large amount of granular products being generated from the Pt film 14 are adhered onto the etching side surface of the PZT film 16.

Most of the granular products are removed by the HBr—$O_2$ mixed gas plasma used in the etching applied to form the lower electrode, but a part of the granular products still remains on the etching side surface of the PZT film. Since the granular products are the conductive substance, such granular products cause the capacitor leakage.

Accordingly, it is important that the granular products are not generated as few as possible in the etching of the Pt film.

Therefore, experiments were executed to suppress the generation of the granular products.

In the experiments, three items, i.e., the change of the wafer stage temperature, the change of the pressure in the etching reaction atmosphere, and the change of the $Cl_2$ partial pressure were checked. Experimental results are shown in FIGS. 14A and 14B, FIGS. 15A and 15B, and FIGS. 16A and 16B.

Figure 14A:
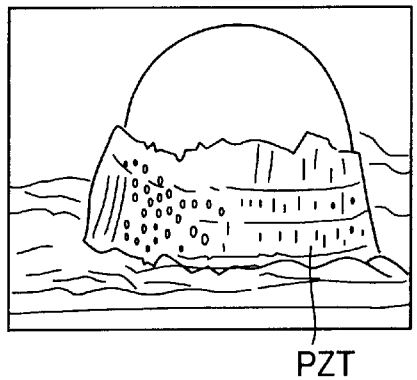
FIGS. 14A and 14B are perspective views, illustrated based on microphotographs, showing differences in adhesion of the etching product onto an etched side surface of the PZT film when a temperature in etching the PZT film constituting the capacitor of the semiconductor device according to the embodiment of the present invention is changed.
Figure 14B:
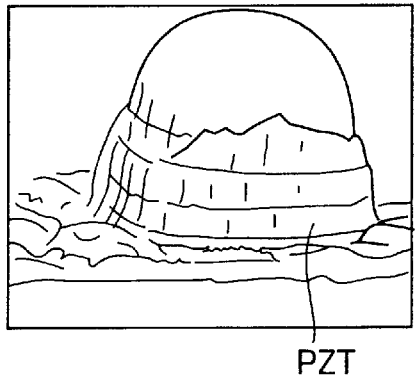

FIG. 14A shows the state after the PZT film was etched at the wafer stage temperature of 400° C., and FIG. 14B shows the state after the PZT film was etched at the wafer stage temperature of 350° C. In these cases, $Cl_2$ and Ar were introduced into the etching atmosphere at the flow rate of 40 sccm and 10 sccm respectively to maintain the pressure of the etching atmosphere at 0.15 Pa.

Figure 15A:
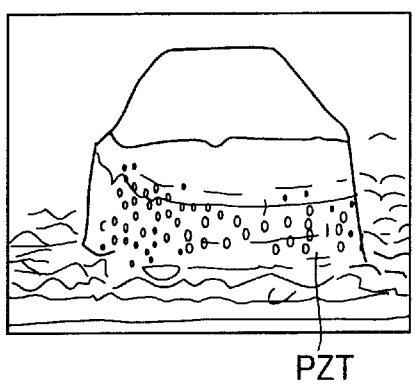
FIGS. 15A and 15B are perspective views, illustrated based on microphotographs, showing differences in adhesion of the etching product onto an etched side surface of the PZT film when a pressure in etching the PZT film constituting the capacitor of the semiconductor device according to the embodiment of the present invention is changed.
Figure 15B:
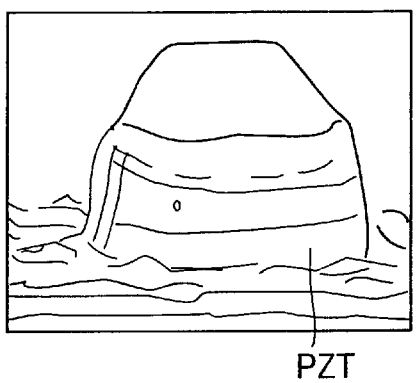

Also, FIG. 15A shows the state after the PZT film was etched at the pressure in the etching atmosphere of 0.4 Pa, and FIG. 15B shows the state after the PZT film was etched at the pressure in the etching atmosphere of 0.15 Pa. In these cases, $Cl_2$ and Ar were introduced into the etching atmosphere at the flow rate of 40 sccm and 10 sccm respectively and also the wafer stage temperature was set to 350° C.

Figure 16A:
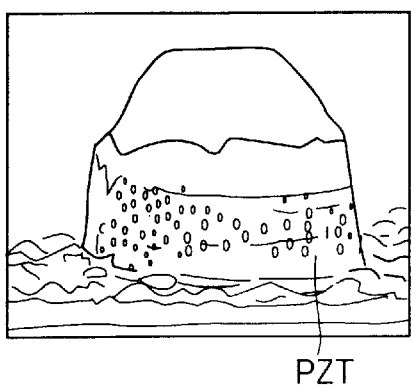
FIGS. 16A and 16B are perspective views, illustrated based on microphotographs, showing differences in adhesion of the etching product onto an etched side surface of the PZT film when a partial pressure of chlorine in etching the PZT film constituting the capacitor of the semiconductor device according to the embodiment of the present invention is changed.
Figure 16B:
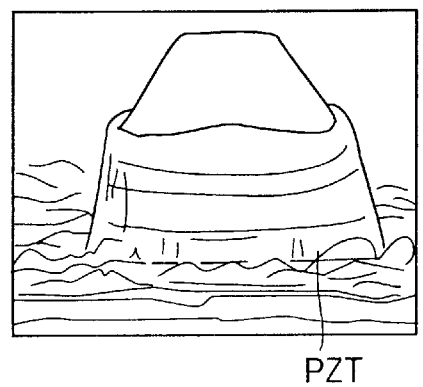

In addition, FIG. 16A shows the state after the PZT film was etched by introducing $Cl_2$ and Ar into the etching atmosphere at the flow rate of 40 sccm and 10 sccm respectively, and FIG. 16B shows the state after the PZT film was etched by introducing $Cl_2$ and Ar into the etching atmosphere at the flow rate of 10 sccm and 40 sccm respectively. In these cases, the etching atmosphere was set to 0.15 Pa and the wafer stage temperature was set to 350° C.

In FIG. 14A, FIG. 15A, and FIG. 16A, it is understood that a plenty of granular products were adhered onto the side surface of the PZT film. In contrast, in FIG. 14B, FIG. 15B, and FIG. 16B, the granular products were not adhered onto the side surface of the PZT film, and merely a small amount of the granular products were adhered even if they were adhered.

According to such experimental results obtained by changing the parameters, the effect of suppressing the generation of the product on the side surface of the capacitor could be achieved by lowering the wafer stage temperature, reducing the pressure in the reaction atmosphere, and reducing the partial pressure of the chlorine. That is, it is possible to say that the reaction between $Cl_2$ and Pt should be suppressed.

In FIGS. 14A and 14B, FIGS. 15A and 15B, and FIGS. 16A and 16B, the unevenness appeared on the surface of the Pt film around the capacitor shape pattern, and a part of the PZT film was still left like the grain on the underlying Pt film when the PZT film was just etched.

The $HBr$—$O_2$ mixed gas plasma is used to etch the first conductive film 15 after the etching of the PZT ferroelectric film 16. In this case, since the etching rate of PZT by such gas plasma is low, the residue of PZT acts as a mask and thus the etching residue occurs on the first conductive film 15. In order to overcome such disadvantage, the over-etching of about 20% in terms of the film thickness must be applied after the etching of the PZT film.

In contrast, when the PZT film is etched under the conditions that the PZT granular residue is not generated, a taper angle of the side surface becomes gentler (is reduced smaller).

Figure 17A:
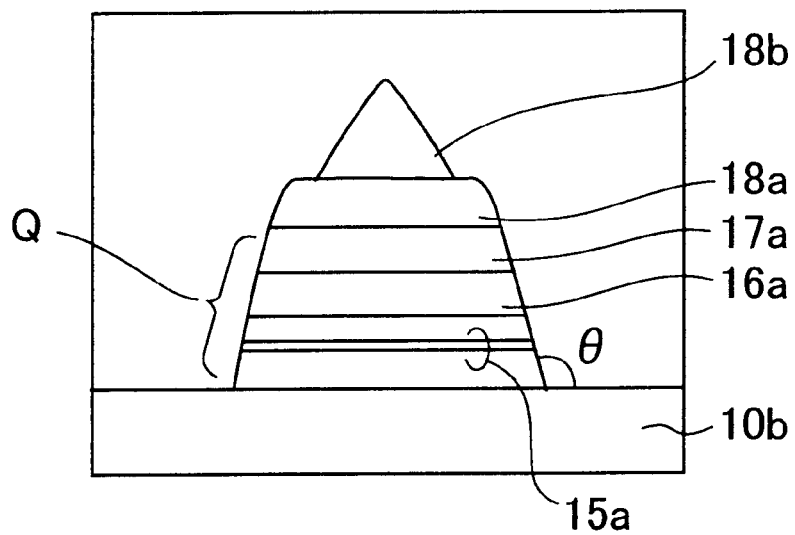
FIGS. 17A and 17B are sectional views showing differences in a taper angle of the capacitor side surface due to a difference of the wafer stage temperature in the etching to form the capacitor of the semiconductor device according to the embodiment of the present invention.
Figure 17B:
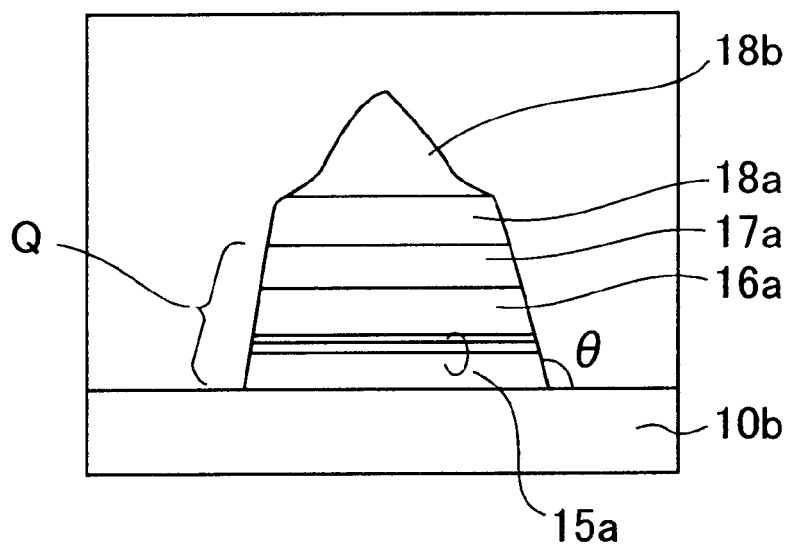

For example, in order not to generate the etching residue on the side wall of the capacitor, etching elements by the sputter may be increased by suppressing the etching by the chemical reaction, but the taper angle of the capacitor becomes gentle. As the method of suppressing the etching by the chemical reaction, there is the method of lowering the wafer stage temperature in the etching. FIG. 17A shows the state that the capacitor Q was formed by etching the second conductive film 17 to the first conductive film 15 at the wafer stage temperature of 300° C. Also, FIG. 17B shows the state that the capacitor Q was formed by etching the second conductive film 17 to the first conductive film 15 at the wafer stage temperature of 400° C.

The taper angle θ of the side surface of the capacitor shown in FIG. 17A became 76 degree. In contrast to this, the taper angle θ of the side surface of the capacitor shown in FIG. 17B became 79 degree.

Not to generate the granular residues after the PZT film etching, it is effective to use two-step etching as the etching of the PZT film. That is, the generation of the granular residues may be suppressed by suppressing the reaction with the Pt film by executing the chemical-reactive etching between $Cl_2$ and PZT in the first step and then changing the wafer stage temperature, the gas flow rate, the reaction pressure, etc. to execute the sputter-reactive etching as the second step prior to the PZT film just-etching, by which the underlying Pt film is exposed.

(Plasma Post-Process After the Etching)

It is effective in the improvement in the taper angle of the side surface of the capacitor to add the fluorine gas such as $CF_4$, $C_4F_8$, or $CHF_3$ to the etching. In addition, the etching rate can be improved by adding the fluorine gas.

For example, in some cases the sidewall depositions are adhered onto the side walls of the capacitor after the capacitor was formed by etching the first conductive film, the ferroelectric film, and the second conductive film. Therefore, the experiment was made to remove the sidewall depositions.

First, the multi-layered film for the stacked capacitor was etched as the sample while using the hard mask 18 having the double-layered structure, which is obtained by forming sequentially a TiN film of 0.2 μm thickness and a silicon oxide film (TEOS oxide film) of 1.2 μm thickness, and then the TEOS oxide film as the hard mask was removed. The silicon oxide film was formed by using TEOS as the source.

Then, when the sample was exposed to the plasma atmosphere, into which HBr, $O_2$, and $C_4F_8$ were introduced at the flow rates of 5 sccm, 45 sccm, and 5 sccm respectively, for 15 seconds, the deposition being adhered onto the side walls of the capacitor could be removed. In this etching, the pressure in the atmosphere was set to 0.4 Pa, the source power was set to 800 watt, the bias power was set to 700 watt, and the stage temperature was set to 400° C.

As a result, it is found that, if the side walls of the capacitor were exposed to the mixed gas plasma consisting of HBr, $O_2$, and $C_4F_8$ for a relatively short time after the hard mask material was removed, the sidewall depositions could be removed.

By the way, the addition of the fluorine gas has the effect of not-adhering the deposition product onto the side walls of the capacitor. According to this, the leakage current of the capacitor can be reduced and also the angle of the side walls of the capacitor can be increased larger.

As described above, in the etching to form the lower electrodes, it is preferable that HBr and $O_2$ should be introduced into the etching atmosphere, but the sidewall depositions are not completely removed by the over-etching. The reason for this may be considered such that, since the reactivity of the etching gas is poor, the etching product is adhered once again onto the side walls of the capacitor. Therefore, the improvement of the reactivity in the etching by adding the fluorine gas into the etching gas will be explained hereunder.

Figure 18:
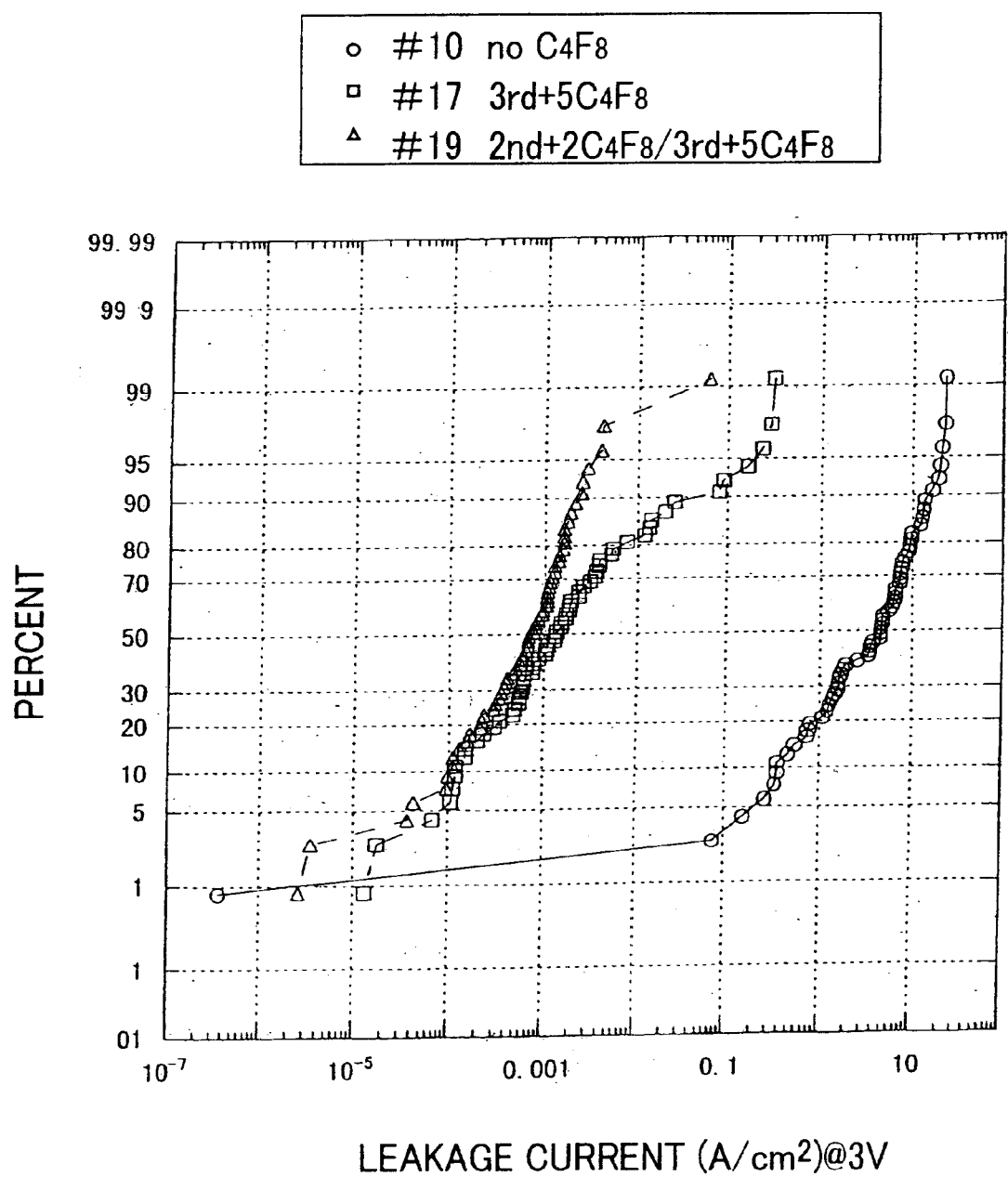
FIG. 18 is a view showing difference in a capacitor leakage current due to difference of the etching conditions to form the capacitor of the semiconductor device according to the embodiment of the present invention.

FIG. 18 shows examined results of the leakage current generated under the condition that $C_4F_8$ was added into the etching gas at the flow rate of 5 sccm when the first conductive film 15 serving as the lower electrode 15a was etched. In this case, simultaneously the source power was increased from 800 watt to 1000 watt, and the bias power was reduced from 700 watt to 500 watt to lower the voltage applied to the semiconductor wafer.

According to FIG. 18, the leakage current of the capacitors (#17, #19) both having the lower electrode, which was formed in the conditions that $C_4F_8$ was added into the etching gas, could be improved in almost 2 to 3 figures rather than that of the capacitor (#10) having the lower electrode, which was formed in the conditions that $C_4F_8$ was not added.

The taper angle θ of the side wall of the capacitors (#17, #19) having the lower electrode, which was formed in the conditions that $C_4F_8$ was added into the etching gas, to the underlying insulating film 10b was 84 degree. In contrast, the taper angle θ of the side wall of the capacitor (#10) having the lower electrode, which was formed in the conditions that $C_4F_8$ was not added, to the underlying insulating film 10b was 80 degree.

The constituent materials and the etching conditions of the upper electrode (second conductive film), the ferroelectric film, and the lower electrode constituting these capacitors are given in Table 1, Table 2 and Table 3.

TABLE 1

Capacitor (#10) Etching conditions

| | Pressure (Pa) | source power (watt) | bias power (watt) | gas seed: flow rate (sccm) | wafer stage temperature (° C.) | others |
|---|---|---|---|---|---|---|
| upper electrode ($IrO_x$) | 0.4 | 800 | 700 | HBr:10 $O_2$:40 | 400 | 10% OE |
| ferrolectric film (PZT) | 0.4 | 800 | 700 | $Cl_2$:40 Ar:10 | 400 | EPD |
| lower electrode (Pt/PtO/$IrO_x$/Ir) | 0.4 | 800 | 700 | HBr:10 $O_2$:40 | 400 | 60% OE |

TABLE 1

Capacitor (#17) Etching conditions

| | Pressure (Pa) | source power (watt) | bias power (watt) | gas seed: flow rate (sccm) | wafer stage temperature (° C.) | others |
|---|---|---|---|---|---|---|
| upper electrode ($IrO_x$) | 0.4 | 800 | 700 | HBr:10 $O_2$:40 | 400 | 10% OE |
| ferroelectric film (PZT) | 0.4 | 800 | 700 | $Cl_2$:40 Ar:10 | 400 | EPD |
| lower electrode (Pt/PtO/$IrO_x$/Ir) | 0.4 | 1000 | 500 | HBr:10 $O_2$:40, $C_4F_8$:5 | 400 | 60% OE |

TABLE 3

Capacitor (#19) Etching conditions

| | Pressure (Pa) | source power (watt) | bias power (watt) | gas seed: flow rate (sccm) | wafer stage temperature (° C.) | others |
|---|---|---|---|---|---|---|
| upper electrode ($IrO_x$) | 0.4 | 800 | 700 | HBr:10 $O_2$:40 | 400 | 10% OE |
| ferroelectric film (PZT) | 0.4 | 800 | 700 | $Cl_2$:40, Ar:10 $C_4F_8$:2 | 400 | EPD |
| lower electrode (Pt/PtO/$IrO_x$/Ir) | 0.4 | 1000 | 500 | HBr:10, $O_2$:40 $C_4F_8$:5 | 400 | 60% OE |

By the way, the addition of the fluorine gas in etching to pattern the conductive films as the electrodes of the capacitor can also have the effect of stabilizing the etching. For example, even if the cumulative processed sheet number in the etching was increased in the etching equipment shown in FIG. 3, the etching time required to pattern the conductive films was not increased but was substantially constant. Unless the fluorine gas was added, the etching time of the conductive films was prolonged with the increase of the cumulative processed sheet number in the etching.

(Other Forming Example of the Capacitor)

Figure 19A:
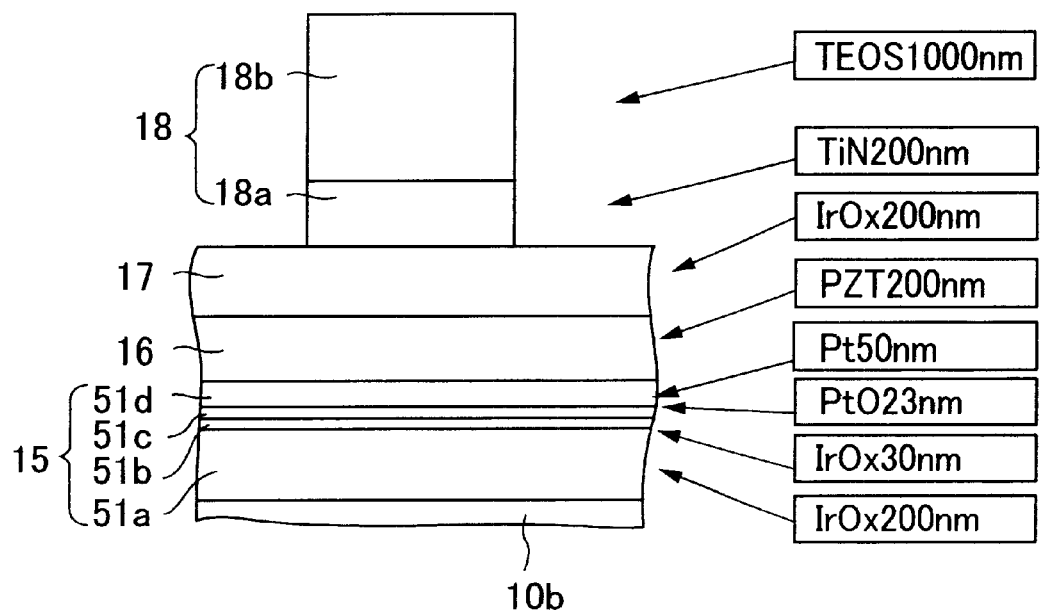
FIGS. 19A and 19B are sectional views showing steps of forming other capacitor of the semiconductor device according to the embodiment of the present invention.
Figure 19B:
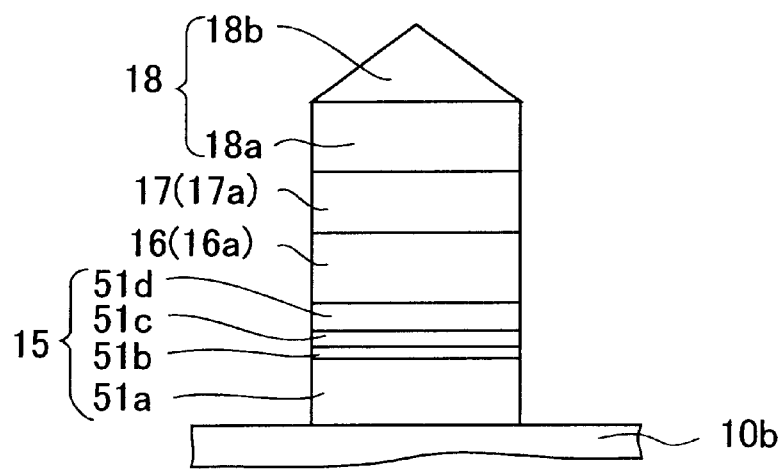

Steps of forming the capacitor having the lower electrode structure that is different from that in FIG. 2H are shown in FIGS. 19A and 19B.

First, as shown in FIG. 19A, an iridium film 51a of 200 nm thickness, an iridium oxide film 51b of 30 nm thickness, a platinum oxide film 51c of 23 nm thickness, and a platinum film 51d of 50 nm thickness are formed sequentially on the underlying insulating film 10b, and this multi-layered structure film is used as the first conductive film 15. Then, the PZT film of 200 nm thickness is formed on the first conductive film 15 as the ferroelectric film 16, and then the IrOx film of 200 nm thickness is formed on the ferroelectric film 16 as the second conductive film 17. Then, the TiN film 18a of 200 nm thickness and the silicon oxide film 18b of 1000 nm thickness are formed sequentially on the second conductive film 17. The silicon oxide film 18b is grown by using TEOS as the growth source.

In addition, the hard mask 18 is formed by etching the TiN film 18a and the silicon oxide film 18b while using the resist pattern having the capacitor planar shape. In this case, the silicon oxide film 18b and the TiN film 18a are etched by using separate etchers respectively. The details of the etching to form the capacitor will be shown in the following.

When the capacitor having the stacked structure is to be formed, the etching is carried out as the step etching to suppress the degradation of the capacitor and the formation of the fence on the side surfaces of the capacitor. The first and second conductive films 15, 17 are etched by using the gas containing HBr, and the PZT ferroelectric film 16 is etched by using the gas containing $Cl_2$. In this case, three-step etching is applied.

Since the PZT film is hard to be etched by the HBr gas, the degradation of performances of the capacitor is brought about. Therefore, the PZT film is etched by the $Cl_2$ gas. Also, if $O_2$ is added to the $Cl_2$ gas, the etching rate of the PZT film is considerably lowered to produce the etching residue on the first conductive film 15, and thus the oxygen is not added during the etching of the PZT film. In addition, as described above, the improvement in the taper angle of the etching side surface, the suppression of the deposition adhesion on the etching side surface, and the improvement in the etching rate of the film can be attained by adding the fluorine gas.

As a result, the fluorine gas may be added every etching step. If the underlying film of the PZT ferroelectric film 16 is the Pt film 51*d*, the granular products are generated and adhered onto the side walls of the capacitor since the Pt film 51*d* is etched by the $Cl_2$ plasma. In order to suppress this event, 2-step process such that the wafer stage temperature is lowered after the etching of the PZT ferroelectric film 16 made progress to some extent, otherwise the PZT ferroelectric film 16 is etched in the condition that such PZT ferroelectric film 16 is difficult to react with the Pt film 51*d* may be employed. Accordingly, the capacitor can be formed by four-step etching process.

Also, there is the case that the optimum value of the wafer stage temperature in each etching step is different. In such case, the method of changing the etching chamber every step may be employed to get the etching method that can conform to the flow production. Also, the side-wall deposition of the capacitor may be removed by the plasma post-process after the hard mask 18 is removed. Examples of these etching methods are shown in the following, but there are many etching methods other than them.

According to such etching, the capacitor having the structure shown in FIG. 19B is formed. More particularly, the upper electrode 17*a* of the capacitor is formed by etching the second conductive film 17 using the hard mask 18, then the dielectric film 16*a* of the capacitor is formed by etching the ferroelectric film 16, and then the lower electrode 15*a* of the capacitor is formed by etching the first conductive film 15.

In this case, the oxide film etcher is used to remove the silicon oxide film 18*b* constituting the hard mask 18, and the down-flow asher or the ammonia peroxide is used to remove the TiN film 18*a*.

Next, examples of the etching conditions to pattern the multi-layered structure film shown in FIG. 19A are given in Table 1 to Table 5. The thickness of the multi-layered structure film is described as above. Also, in Table 1 to Table 5, "OE" denotes an over-etching amount in terms of the film thickness, and "EPD" denotes that the etching is stopped by using the end point detecting device.

TABLE 4

Etching 1

|  | Pressure (Pa) | source power (watt) | bias power (watt) | gas seed: flow rate (sccm) | wafer stage temperature (° C.) | others |
| --- | --- | --- | --- | --- | --- | --- |
| upper electrode ($IrO_x$) | 0.4 | 800 | 700 | HBr:10 $O_2$:40 | 400 | 10% OE |
| ferroelectric film (PZT) | 0.4 | 800 | 700 | $Cl_2$:40 Ar:10 | 400 | EPD |
| lower electrode (Pt/PtO/$IrO_x$/Ir) | 0.4 | 800 | 700 | HBr:10 $O_2$:40 | 400 | 60% OE |

TABLE 5

Etching 2

|  | Pressure (Pa) | source power (watt) | bias power (watt) | gas seed: flow rate (sccm) | wafer stage temperature (° C.) | others |
| --- | --- | --- | --- | --- | --- | --- |
| upper electrode ($IrO_x$) | 0.4 | 800 | 700 | HBr:10 $O_2$:40 | 400 | 10% OE |
| ferroelectric film (PZT) | 0.4 | 800 | 700 | $Cl_2$:40 Ar:10 | 400 | 30-sec etch |
| 2-step etching | 0.15 | 800 | 700 | $Cl_2$:10 Ar:2.5 | 400 | 20% OE |
| lower electrode (Pt/PtO/$IrO_x$/Ir) | 0.4 | 800 | 700 | HBr:10 $O_2$:40 | 400 | 60% OE |

TABLE 6

Etching 3

|  | Pressure (Pa) | source power (watt) | bias power (watt) | gas seed: flow rate (sccm) | wafer stage temperature (° C.) | others |
| --- | --- | --- | --- | --- | --- | --- |
| upper electrode ($IrO_x$) | 0.4 | 800 | 700 | HBr:10 $O_2$:40 | 400 | 10% OE |
| ferroelectric film (PZT) | 0.4 | 800 | 700 | $Cl_2$:40, Ar:10 $C_4F_8$:5 | 350 | EPD |

TABLE 6-continued

Etching 3

| | Pressure (Pa) | source power (watt) | bias power (watt) | gas seed: flow rate (sccm) | wafer stage temperature (° C.) | others |
|---|---|---|---|---|---|---|
| lower electrode (Pt/PtO/IrO$_x$/Ir) | 0.4 | 800 | 700 | HBr:10, O$_2$:40 C$_4$F$_8$:5 | 350 | 60% OE |

TABLE 7

Etching 4

| | Pressure (Pa) | source power (watt) | bias power (watt) | gas seed: flow rate (sccm) | wafer stage temperature (° C.) | others |
|---|---|---|---|---|---|---|
| upper electrode (IrO$_x$) | 0.4 | 800 | 700 | HBr:10 O$_2$:40 | 400 | 10% OE |
| ferroelectric film (PZT) | 0.4 | 800 | 700 | Cl$_2$:40 Ar:10 | 350 | EPD |
| lower electrode (Pt/PtO/IrO$_x$/Ir) | 0.4 | 800 | 700 | HBr:10 O$_2$:40 | 400 | 60% OE |

TABLE 8

Etching 5

| | Pressure (Pa) | source power (watt) | bias power (watt) | gas seed: flow rate (sccm) | wafer stage temperature (° C.) | others |
|---|---|---|---|---|---|---|
| upper electrode (IrO$_x$) | 0.4 | 800 | 700 | HBr:10 O$_2$:40 | 400 | 10% OE |
| ferroelectric film (PZT) | 0.4 | 800 | 700 | Cl$_2$:40 Ar:10 | 400 | EPD |
| lower electrode (Pt/PtO/IrO$_x$/Ir) | 0.4 | 800 | 700 | HBr:10 O$_2$:40 | 400 | 60% OE |
| plasma post-process | 0.4 | 800 | 700 | HBr:10, O$_2$:40 C$_4$F$_8$:5 | 400 | 15 seconds |

In Table 4, the already-described etching conditions are given.

In Table 5, when the underlying film of the PZT film was the Pt film, the granular products were generated when the Pt film was etched by Cl$_2$. In order to suppress the generation of the product, the PZT etching as the condition, which is hard to react with Pt, was applied as two-step etching. Of course, all the PZT film may be etched on the same condition as the second-step condition of the PZT film etching, which is hard to react with Pt.

In Table 6, the effects such as the improvement in the taper angle, the suppression of the deposition on the side walls, the improvement in the etching rate, etc. could be achieved by adding the fluorine gas. Accordingly, the fluorine gas may be added every step. In Table 7 and Table 8, the examples in which the C$_4$F$_8$ gas was added by 5 sccm in the PZT etching and the lower electrode etching were given. It is as a matter of course that an addition rate may be adjusted every step.

In Table 7, if the underlying film of the PZT film was the Pt film, the granular products were generated when the Pt film was etched by Cl$_2$. In order to suppress such generation, the method of lowering the wafer stage temperature in etching the PZT film to reduce the reaction with Pt may be employed. In this case, since the taper angle of the etching side surface of the PZT film becomes gentle, the fluorine gas may be added to sharpen the taper angle. Also, if the etching conditions of the PZT film are to be changed, the etching may be carried out in a plurality of different chambers every condition.

In Table 8, sometimes the side-wall depositions were adhered onto the side walls of the capacitor after all the etchings were completed. Such deposition can be removed by exposing the capacitor to the mixed gas plasma consisting of HBr, O$_2$, and C$_4$F$_8$ for a short time after the masking material was removed by other etching equipment, or the like. The plasma post-process may be carried out in another chamber.

In this case, the lower electrode of the capacitor structure may be constructed as a single-layer structure, such as iridium, iridium oxide, platinum, platinum oxide, or SRO. For example, the lower electrode may be formed of the iridium film, the ferroelectric film may be formed of the PZT, and the upper electrode may be formed of the iridium oxide, so that the capacitor may be constructed. These films of respective layers are formed by the MOCVD method, for example.

In the above embodiment, the ferroelectric capacitor was explained. The above etching technology may be employed when the high-dielectric capacitor in which the dielectric film is constructed by the high-dielectric material is formed.

As described above, according to the present invention, the conductive film constituting the capacitor electrode is etched in the Br-containing atmosphere when such conductive film is patterned, and the ferroelectric film or the high-dielectric film constituting the capacitor dielectric film is etched in the Cl-containing atmosphere when such film is patterned. Therefore, the side surfaces of the capacitor electrode pattern can be shaped into the almost perpendicular shape to contribute the higher integration of the semiconductor device, and also the degradation in the film quality of the dielectric film pattern can be suppressed and thus the deterioration of the capacitor characteristics can be prevented.

Also, according to another invention, the conductive film constituting the capacitor electrode is etched in the etching atmosphere containing the oxygen when such conductive film is patterned, and the ferroelectric film or the high-dielectric film constituting the capacitor dielectric film is etched in the etching atmosphere containing the gas except the oxygen when such film is patterned. Therefore, the gradation of the dielectric film can be suppressed in etching the capacitor electrode if the dielectric film is formed of the oxide, and also the reduction in the etching rate can be prevented in the etching of the dielectric film.

What is claimed is:

1. A method of manufacturing a semiconductor device comprising the steps of:
    forming an underlying insulating film over a semiconductor substrate;
    forming a first conductive film over the underlying insulating film;
    forming a dielectric film consisting of one of ferroelectric material and high-dielectric material on the first conductive film;
    forming a second conductive film on the dielectric film;
    forming a mask over the second conductive film;
    etching selectively the second conductive film exposed from the mask in a first atmosphere containing a bromine to shape the second conductive film into a capacitor upper electrode;
    etching selectively the dielectric film exposed from the mask in a second atmosphere containing a chlorine to shape the dielectric film into a capacitor dielectric film; and
    etching selectively the first conductive film exposed from the mask in a third atmosphere containing the bromine to shape the first conductive film into a capacitor lower electrode.

2. A method of manufacturing a semiconductor device according to claim 1, wherein the mask is a hard mask having a capacitor shape.

3. A method of manufacturing a semiconductor device according to claim 2, wherein the hard mask has a double-layered structure consisting of titanium nitride and silicon oxide.

4. A method of manufacturing a semiconductor device according to claim 1, wherein at least one of the first atmosphere and the third atmosphere is an atmosphere into which HBr and $O_2$ are introduced.

5. A method of manufacturing a semiconductor device according to claim 1, wherein the second atmosphere is an atmosphere into which a chlorine and an argon are introduced.

6. A method of manufacturing a semiconductor device according to claim 5, wherein a flow rate of the argon is set larger than that of the chlorine.

7. A method of manufacturing a semiconductor device according to claim 1, wherein a flow rate of the chlorine is set larger than that of the argon, and depositions on side surfaces of the capacitor dielectric film are removed after the dielectric film is etched.

8. A method of manufacturing a semiconductor device according to claim 1, wherein a fluorine-containing gas is introduced into at least one of the second atmosphere and the third atmosphere.

9. A method of manufacturing a semiconductor device according to claim 1, wherein at least one of the first atmosphere, the second atmosphere and the third atmosphere is a plasma atmosphere.

10. A method of manufacturing a semiconductor device according to claim 1, further comprising the step of exposing the capacitor dielectric film to the plasma atmosphere after the first conductive film is etched.

11. A method of manufacturing a semiconductor device according to claim 10, wherein a fluorine is contained in the plasma atmosphere.

12. A method of manufacturing a semiconductor device according to claim 1, wherein the etching of the dielectric film in the second atmosphere is carried out by a plurality of steps while changing conditions.

13. A method of manufacturing a semiconductor device according to claim 12, wherein the etching of the dielectric film has a higher sputter element in a last condition than preceding conditions.

14. A method of manufacturing a semiconductor device according to claim 12, wherein the second atmosphere is set to different chambers every condition.

15. A method of manufacturing a semiconductor device according to claim 12, wherein a change of the conditions is a change of at least one of a heating temperature of the substrate, a pressure in an etching atmosphere, and a gas partial pressure.

16. A method of manufacturing a semiconductor device according to claim 1, wherein the underlying insulating film is a silicon oxide film.

17. A method of manufacturing a semiconductor device according to claim 1, wherein an over-etching is applied to at least one of the first conductive film, the dielectric film, and the second conductive film.

18. A method of manufacturing a semiconductor device according to claim 1, wherein the ferroelectric film is formed of PZT material or bismuth compound material.

19. A method of manufacturing a semiconductor device according to claim 1, wherein at least one of the first conductive film and the second conductive film is formed of one of a single-layer film consisting of iridium, iridium oxide, platinum, platinum oxide, and SRO, or a multi-layered structure film in which one of iridium, iridium oxide, platinum, platinum oxide, and SRO is selected.

20. A method of manufacturing a semiconductor device comprising the steps of:
    forming an underlying insulating film over a semiconductor substrate;
    forming a first conductive film over the underlying insulating film;
    forming a dielectric film consisting of one of ferroelectric material and high-dielectric material on the first conductive film;
    forming a second conductive film on the dielectric film;
    forming a mask over the second conductive film;
    etching selectively the second conductive film exposed from the mask in a first atmosphere, into which a first etching gas and an oxygen are introduced, to shape the second conductive film into a capacitor upper electrode;

etching selectively the dielectric film exposed from the mask in a second atmosphere, into which a second etching gas not-containing the oxygen is introduced, to shape the dielectric film into a capacitor dielectric film; and etching the first conductive film exposed from the mask in a third atmosphere, into which a third etching gas and the oxygen are introduced, to shape the first conductive film into a capacitor lower electrode.

21. A method of manufacturing a semiconductor device according to claim 20, wherein the mask is a hard mask having a capacitor shape.

22. A method of manufacturing a semiconductor device according to claim 21, wherein the hard mask has a double-layered structure consisting of titanium nitride and silicon oxide.

23. A method of manufacturing a semiconductor device according to claim 20, wherein at least one of the first atmosphere and the third atmosphere is an atmosphere into which HBr and $O_2$ are introduced.

24. A method of manufacturing a semiconductor device according to claim 20, wherein the second atmosphere is an atmosphere into which a chlorine and an argon are introduced.

25. A method of manufacturing a semiconductor device according to claim 24, wherein a flow rate of the argon is set larger than that of the chlorine.

26. A method of manufacturing a semiconductor device according to claim 20, wherein a flow rate of the chlorine is set larger than that of the argon, and depositions on side surfaces of the capacitor dielectric film are removed after the dielectric film is etched.

27. A method of manufacturing a semiconductor device according to claim 20, wherein a fluorine-containing gas is introduced into at least one of the second atmosphere and the third atmosphere.

28. A method of manufacturing a semiconductor device according to claim 20, wherein at least one of the first atmosphere, the second atmosphere and the third atmosphere is a plasma atmosphere.

29. A method of manufacturing a semiconductor device according to claim 20, further comprising the step of exposing the capacitor dielectric film to the plasma atmosphere after the first conductive film is etched.

30. A method of manufacturing a semiconductor device according to claim 29, wherein a fluorine is contained in the plasma atmosphere.

31. A method of manufacturing a semiconductor device according to claim 20, wherein the etching of the dielectric film in the second atmosphere is carried out by a plurality of steps while changing conditions.

32. A method of manufacturing a semiconductor device according to claim 31, wherein the etching of the dielectric film has a higher sputter element in a last condition than preceding conditions.

33. A method of manufacturing a semiconductor device according to claim 31, wherein the second atmosphere is set to different chambers every condition.

34. A method of manufacturing a semiconductor device according to claim 31, wherein a change of the conditions is a change of at least one of a heating temperature of the semiconductor substrate, a pressure in an etching atmosphere, and a gas partial pressure.

35. A method of manufacturing a semiconductor device according to claim 20, wherein the underlying insulating film is a silicon oxide film.

36. A method of manufacturing a semiconductor device according to claim 20, wherein an over-etching is applied to at least one of the first conductive film, the dielectric film, and the second conductive film.

37. A method of manufacturing a semiconductor device according to claim 20, wherein the ferroelectric film is formed of PZT material or bismuth compound material.

38. A method of manufacturing a semiconductor device according to claim 20, wherein at least one of the first conductive film and the second conductive film is formed of one of a single-layer film consisting of iridium, iridium oxide, platinum, platinum oxide, and SRO, or a multi-layered structure film in which any one of iridium, iridium oxide, platinum, platinum oxide, and SRO is selected.

* * * * *